(12) United States Patent
Oda et al.

(10) Patent No.: US 8,906,746 B2
(45) Date of Patent: *Dec. 9, 2014

(54) METHOD FOR PRODUCING SEMICONDUCTOR DEVICE

(71) Applicant: Nitto Denko Corporation, Ibaraki (JP)

(72) Inventors: Takashi Oda, Ibaraki (JP); Kosuke Morita, Ibaraki (JP); Eiji Toyoda, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/931,525

(22) Filed: Jun. 28, 2013

(65) Prior Publication Data

US 2013/0288428 A1    Oct. 31, 2013

Related U.S. Application Data

(63) Continuation of application No. 13/631,286, filed on Sep. 28, 2012, now Pat. No. 8,580,619.

(30) Foreign Application Priority Data

Sep. 28, 2011    (JP) .................................. 2011-213028

(51) Int. Cl.

| | |
|---|---|
| H01L 21/00 | (2006.01) |
| H01L 21/50 | (2006.01) |
| H01L 21/683 | (2006.01) |
| H01L 23/544 | (2006.01) |
| H01L 23/00 | (2006.01) |
| H01L 21/56 | (2006.01) |
| H01L 23/31 | (2006.01) |

(52) U.S. Cl.
CPC ....... *H01L 21/50* (2013.01); *H01L 2223/54486* (2013.01); *H01L 2924/01029* (2013.01); *H01L 21/6836* (2013.01); *H01L 23/544* (2013.01); *H01L 2924/15311* (2013.01); *H01L 24/97* (2013.01); *H01L 24/19* (2013.01); *H01L 2224/04105* (2013.01); *H01L 2924/01012* (2013.01); *H01L 21/561* (2013.01); *H01L 21/568* (2013.01); *H01L 23/3128* (2013.01); *H01L 2221/68336* (2013.01); *H01L 2223/54433* (2013.01); *H01L 24/20* (2013.01)
USPC .................... 438/118; 438/127; 257/E21.502

(58) Field of Classification Search
None
See application file for complete search history.

(56) References Cited

U.S. PATENT DOCUMENTS

| 7,202,107 B2 | 4/2007 | Fuergut et al. |
| 2004/0232543 A1 | 11/2004 | Goller et al. |
| 2011/0057304 A1 | 3/2011 | Beer et al. |

*Primary Examiner* — Cheung Lee
(74) *Attorney, Agent, or Firm* — Alleman Hall McCoy Russell & Tuttle LLP

(57) ABSTRACT

A method for producing a semiconductor device, including a semiconductor chip, for improving production efficiency and the flexibility of production design is provided. The method comprises: preparing a semiconductor chip having a first main surface on which an electroconductive member is formed; preparing a supporting structure in which, over a support configured to transmit radiation, a radiation curable pressure-sensitive adhesive layer and a first thermosetting resin layer are laminated in this order; arranging the semiconductor chips on the first thermosetting resin layer to face the first thermosetting resin layer to a second main surface of the semiconductor chips opposite to the first main surface; laminating a second thermosetting resin layer over the first thermosetting resin layer to cover the semiconductor chips; and curing the radiation curable pressure-sensitive adhesive layer by irradiating from the support side to peel the radiation curable pressure-sensitive adhesive layer from the first thermosetting resin layer.

6 Claims, 2 Drawing Sheets

METHOD FOR PRODUCING SEMICONDUCTOR DEVICE

CROSS REFERENCE TO RELATED APPLICATION

This application is a continuation of and claims priority to U.S. patent application Ser. No. 13/631,286, entitled Method for Producing Semiconductor Device, filed Sep. 28, 2012, the entire disclosure of which is hereby incorporated by reference for all purposes.

BACKGROUND OF THE INVENTION

1. Field of the Invention

The present invention relates to a method for producing a semiconductor device.

2. Description of the Related Art

In recent years, there has been spreading a tendency towards downsizing of semiconductor devices and miniaturization of interconnects thereof that has been increasingly advancing. Thus, a greater number of I/O pads and vias are required to be arranged in a narrow semiconductor chip region (a region of a semiconductor substrate that overlaps semiconductor chips when the chips are seen through in planar view). Simultaneously, the density of pins therein is also increasing. Furthermore, in a ball grid array (BGA) package, many terminals are formed in its semiconductor chip region, so that its region where other elements are to be formed is restricted. Thus, a method of drawing out, on a semiconductor package substrate, wires from terminals in a region outside the chip region is adopted.

Under such a situation, if appropriate measures are taken case by case for the downsizing of semiconductor devices and miniaturization of interconnects thereof, the production efficiency is reduced because of the extension of production lines, an increase in the complexity of the production process, and the like. Thus, such measures cannot fulfill a requirement of cost reduction.

To address this, in order to reduce costs for the production of a semiconductor package, a method of arranging plural chips, which have been made into individual pieces, on a support, and sealing the chips all together with a resin to form a package is suggested. For example, U.S. Pat. No. 7,202,107 discloses a method of arranging plural chips, which have been made into individual pieces, on a thermosensitive adhesive formed on a support, forming a common carrier made of plastic material to cover the chips and the thermosensitive adhesive, and then peeling the common carrier in which the chips are buried and the thermosensitive adhesive from each other by heating.

However, in the method for producing a semiconductor device according to U.S. Pat. No. 7,202,107, the thermosensitive adhesive is used to form the common carrier. Thus, the adhesive imposes a limitation to high-temperature treatment. Furthermore, a cycle of heating and heat-dissipation is necessary. In light of these matters, there remains room for improvement from the viewpoint of the production efficiency of semiconductor devices, and the flexibility of the production design thereof.

SUMMARY OF THE INVENTION

Thus, an object of the present invention is to provide a method for producing a semiconductor device that makes it possible to improve the production efficiency of the semiconductor devices, and the flexibility of the production design thereof.

The inventors have made eager investigations and found out that these problems can be solved by use of a new supporting structure in which semiconductor chips are arranged, and a process using this structure. As a result, the present invention has been accomplished.

That is, the present invention is a method for producing a semiconductor device including a semiconductor chip, comprising:

preparing a semiconductor chip having a first main surface on which an electroconductive member is formed;

preparing a supporting structure in which over a support configured to transmit radiation, a radiation curable pressure-sensitive adhesive layer and a first thermosetting resin layer are laminated, in this order;

arranging the semiconductor chips on the first thermosetting resin layer to face the first thermosetting resin layer to a second main surface of each of the semiconductor chips that is opposite to the first main surface thereof;

laminating a second thermosetting resin layer over the first thermosetting resin layer to cover the semiconductor chips; and curing the radiation curable pressure-sensitive adhesive layer by irradiating from the support side to peel the radiation curable pressure-sensitive adhesive layer and the first thermosetting resin layer from each other.

In this production method, by the use of the supporting structure in which over a support configured to transmit radiation, a radiation curable pressure-sensitive adhesive layer and a first thermosetting resin layer are laminated, in this order, the semiconductor chips arranged beforehand on the supporting structure are covered with the second thermosetting resin layer; and the subsequent curing of the radiation curable pressure-sensitive adhesive layer by the radiation makes it possible to attain easy peeling of this radiation curable pressure-sensitive adhesive layer and the first thermosetting resin layer from each other. Accordingly, no cycle of heating and heat-dissipation is required. Moreover, this method can efficiently cope with the production of semiconductor devices (packages) of various types.

In this production method, it is preferred that the first thermosetting resin layer has a lowest melt viscosity of $5\times10^2$ Pa·s or more and $1\times10^4$ Pa·s or less at a temperature of 50 to 200° C. The first thermosetting resin layer has a lowest melt viscosity in the specified range, and therefore, at the time of the laminating of the second thermosetting resin layer over the first thermosetting resin layer, the semiconductor chips arranged on the first thermosetting resin layer can be prevented from being shifted out of position (hereinafter, the shift may be referred to as "chip shift").

In this production method, it is preferred that the second thermosetting resin layer is a sheet-like thermosetting resin layer. When the second thermosetting resin layer is in a sheet-like state, the semiconductor chips can be buried only by bonding the second thermosetting resin layer onto the first thermosetting resin layer in order to cover the semiconductor chips. Thus, the production efficiency of the semiconductor devices can be improved.

It is preferred that the second thermosetting resin layer comprises an epoxy resin, a phenolic resin, a filler, and an elastomer. Since the second thermosetting resin layer is formed by these components, the semiconductor chips can be satisfactorily buried into the second thermosetting resin layer when the second thermosetting resin layer is bonded over the first thermosetting resin layer.

This production method may further include exposing the electroconductive members outward from a surface of the second thermosetting resin layer after the laminating of the second thermosetting resin layer and before the peeling of the radiation curable pressure-sensitive adhesive layer. In this case, after the electroconductive members are made exposed outward from the surface of the second thermosetting resin layer, a rewiring step may be performed.

Alternatively, the production method may further include, after the peeling of the radiation curable pressure-sensitive adhesive layer, exposing the electroconductive members outward from the surface of the second thermosetting resin layer. In this case, after the electroconductive members are made exposed outward from the surface of the second thermosetting resin layer, a rewiring step may be performed.

The production method may further include, after the peeling of the radiation curable pressure-sensitive adhesive layer, forming a rewire connected to the exposed electroconductive members on the second thermosetting resin layer in order that the rewire can be connected to the substrate of the semiconductor devices to be obtained, or to some other component.

DETAILED DESCRIPTION OF THE PREFERRED EMBODIMENTS

The present invention is a method for producing a semiconductor device including a semiconductor chip, comprising:

preparing a semiconductor chip having a first main surface on which an electroconductive member is formed;

preparing a supporting structure in which over a support configured to transmit radiation, a radiation curable pressure-sensitive adhesive layer and a first thermosetting resin layer are laminated in this order;

arranging the semiconductor chips on the first thermosetting resin layer to face the first thermosetting resin layer to a second main surface of each of the semiconductor chips that is opposite to the first main surface thereof;

laminating a second thermosetting resin layer over the first thermosetting resin layer to cover the semiconductor chips; and curing the radiation curable pressure-sensitive adhesive layer by irradiating from the support side to peel the radiation curable pressure-sensitive adhesive layer and the first thermosetting resin layer from each other.

Figure 1A:
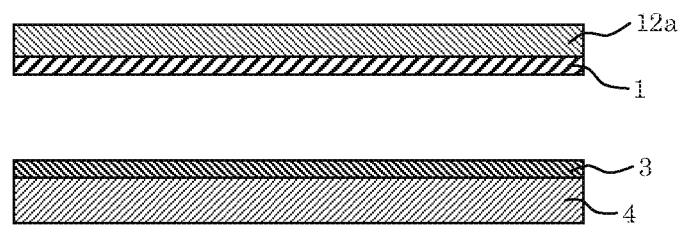
FIGS. 1A and 1B are sectional views that schematically illustrate an example of a process for forming a supporting structure used in the method for producing a semiconductor device of the invention.
Figure 1B:
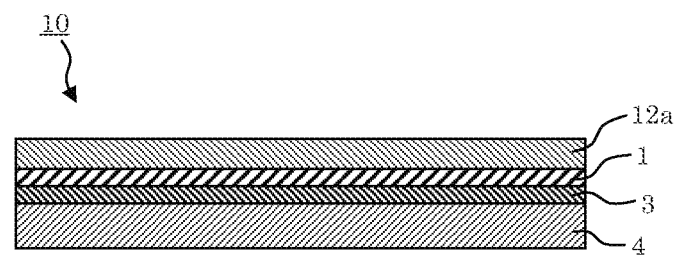

Hereinafter, an embodiment of the invention will be described, referring to the attached drawings. FIGS. 1A and 1B are sectional views that schematically illustrate an example of a process for forming a supporting structure used in the method for producing a semiconductor device of the invention. FIGS. 2A to 2G are schematic sectional views that respectively illustrate steps of the method for producing a semiconductor device according to the embodiment of the invention. In the description, the method for producing a semiconductor device will be discussed first, and then the semiconductor devices yielded by this production method will be generally described.

[Semiconductor Chip Preparing Step]

In a semiconductor chip preparing step, semiconductor chips 5 each having a first main surface 5a on which electroconductive members 6 are formed (see FIG. 2A) are prepared. The semiconductor chips 5a may be formed by dicing a semiconductor wafer having a surface in which circuits are formed into individual pieces in a manner known in the prior art, or by some other method. The respective shapes of the semiconductor chips 5 that are observed when the chips 5 are viewed in plan may be varied in accordance with target semiconductor devices. The shapes may be square or rectangular shapes, the sides of each of the shapes having respective lengths selected independently from a range of 1 to 15 mm.

The respective thicknesses of the semiconductor chips may be varied in accordance with the respective sizes of the target semiconductor devices, and are, for example, from 10 to 725 µm, preferably from 30 to 725 µm.

The electroconductive members 6, which are formed on the first main surfaces (circuit-forming surfaces) 5a of the semiconductor chips 5, are not particularly limited, and examples thereof include bumps, pins, and leads. The material of the electroconductive members 6 is not particularly limited, and examples thereof include solder materials (alloys) such as tin-lead based metal materials, tin-silver based metal materials, tin-silver-copper based metal materials, tin-zinc based metal materials, and tin-zinc-bismuth based metal materials; gold based metal materials; and copper based metal materials. The respective heights of the electroconductive members 6 may be decided in accordance with the usage thereof, and are generally from about 5 to 100 µm. Of course, on the first main surfaces 5a of the semiconductor chips 5, the respective heights of the individual electroconductive members 6 may be equal to or different from each other.

[Supporting Structure Preparing Step]

In a supporting structure preparing step, a supporting structure 10 is prepared, in which over a support 4 configured to transmit radiation, a radiation curable pressure-sensitive adhesive layer 3 and a first thermosetting resin layer 1 are laminated in this order (see FIGS. 1A and 1B).

(Support)

The support 4 is a base for the strength of the supporting structure 10. The material of the support 4 is preferably a material that has radiation-transmissibility, and that has a low stretch property for restraining shifting of the chips, and some other purposes, and has rigidity from the viewpoint of a handling property. Such a material is preferably glass. As long as it satisfies the above mentioned properties, examples thereof also include polyolefin such as low-density polyethylene, straight chain polyethylene, intermediate-density polyethylene, high-density polyethylene, very low-density polyethylene, random copolymer polypropylene, block copolymer polypropylene, homopolypropylene, polybutene, and polymethylpentene; an ethylene-vinylacetate copolymer; an ionomer resin; an ethylene(meth)acrylic acid copolymer; an ethylene(meth)acrylic acid ester (random or alternating) copolymer; an ethylene-butene copolymer; an ethylene-hexene copolymer; polyurethane; polyester such as polyethyleneterephthalate and polyethylenenaphthalate; polycarbonate; polyetheretherketone; polyimide; polyetherimide; polyamide; whole aromatic polyamides; polyphenylsulfide; aramid (paper); glass cloth; a fluoropolymer resin; polyvinyl chloride; polyvinylidene chloride; a cellulose resin; a silicone resin; metal (foil); and paper.

An example of a material of the support 4 includes a polymer such as a cross-linked body of the resins described above. The plastic films may be used in a non-stretched state or may be used in a uniaxially or biaxially stretched state as necessary. The same type or different type of support made of resin can be appropriately selected and used as the support 4, and a support in which a plurality of materials are blended can be used depending on necessity.

A known surface treatment such as a chemical or physical treatment such as a chromate treatment, ozone exposure, flame exposure, high voltage electric exposure, and an ionized ultraviolet treatment, and a coating treatment by an undercoating agent (for example, a tacky substance described later) can be performed on the surface of the support 4 in order to improve adhesiveness, holding properties, etc. with the adjacent layer.

Further, a vapor-deposited layer of a conductive substance composed of a metal, an alloy, an oxide thereof, etc. and having a thickness of about 30 to 500 angstrom can be provided on the support 4 in order to impart an antistatic function to the support 4. The support 4 may be a single layer or a multi layer of two or more types.

The thickness of the support 4 is not particularly limited, and may be determined appropriately. The thickness is generally from about 5 µm to 2 mm, preferably from 100 µm to 1 mm when the handling property thereof is considered.

(Radiation Curable Pressure-Sensitive Adhesive Layer)

The adhesive strength of the radiation curable pressure-sensitive adhesive layer 3 can be reduced easily by increasing the degree of crosslinking by irradiation (irradiation of an ultraviolet ray, electron ray, X ray or the like).

For the radiation curable pressure-sensitive adhesive 3, those substances having a radiation curable functional group such as a carbon-carbon double bond and having adherability can be used without particular limitation. An example of the radiation curable pressure-sensitive adhesive is an addition-type radiation curable pressure-sensitive adhesive in which a radiation curable monomer or oligomer component is incorporated into a general pressure-sensitive adhesive such as the acrylic pressure-sensitive adhesive or the rubber pressure-sensitive adhesive.

An example of the acrylic polymer is a polymer containing an acrylic ester as a main monomer component. Specific examples of the acrylic ester include an acryl polymer in which acrylate is used as a main monomer component. Examples of the acrylate include alkyl acrylate (for example, a straight chain or branched chain alkyl ester having 1 to 30 carbon atoms, and particularly 4 to 18 carbon atoms in the alkyl group such as methyl ester, ethyl ester, propyl ester, isopropyl ester, butyl ester, isobutyl ester, sec-butyl ester, t-butyl ester, pentyl ester, isopentyl ester, hexyl ester, heptyl ester, octyl ester, 2-ethylhexyl ester, isooctyl ester, nonyl ester, decyl ester, isodecyl ester, undecyl ester, dodecyl ester, tridecyl ester, tetradecyl ester, hexadecyl ester, octadecyl ester, and eicosyl ester) and cycloalkyl acrylate (for example, cyclopentyl ester, cyclohexyl ester, etc.). These monomers may be used alone or two or more types may be used in combination.

The acrylic polymer may optionally contain a unit corresponding to a different monomer component copolymerizable with the above-mentioned alkyl ester of (meth)acrylic acid or cycloalkyl ester thereof in order to improve the cohesive force, heat resistance or some other property of the polymer. (Meth)acrylic acid refers to an acrylic acid and/or a methacrylic acid, and hereinafter, every occurrence of (meth) in the present application has a similar meaning with relation to the recited compound. Examples of such a monomer component include carboxyl-containing monomers such as acrylic acid, methacrylic acid, carboxyethyl(meth)acrylate, carboxypentyl(meth)acrylate, itaconic acid, maleic acid, fumaric acid, and crotonic acid; acid anhydride monomers such as maleic anhydride, and itaconic anhydride; hydroxyl-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth) acrylate, 10-hydroxydecyl(meth)acrylate, 12-hydroxylauryl (meth)acrylate, and (4-hydroxylmethylcyclohexyl)methyl (meth)acrylate; sulfonic acid group containing monomers such as styrenesulfonic acid, allylsulfonic acid, 2-(meth) acrylamide-2-methylpropanesulfonic acid, (meth)acrylamidepropanesulfonic acid, sulfopropyl(meth)acrylate, and (meth)acryloyloxynaphthalenesulfonic acid; phosphoric acid group containing monomers such as 2-hydroxyethylacryloyl phosphate; acrylamide; and acrylonitrile. These copolymerizable monomer components may be used alone or in combination of two or more thereof. The amount of the copolymerizable monomer(s) to be used is preferably 40% by weight or less of all the monomer components.

For crosslinking, the acrylic polymer can also contain multifunctional monomers if necessary as the copolymerizable monomer component. Such multifunctional monomers include hexane diol di(meth)acrylate, (poly)ethylene glycol di(meth)acrylate, (poly)propylene glycol di(meth)acrylate, neopentyl glycol di(meth)acrylate, pentaerythritol di(meth) acrylate, trimethylol propane tri(meth)acrylate, pentaerythritol tri(meth)acrylate, dipentaerythritol hexa(meth)acrylate, epoxy(meth)acrylate, polyester(meth)acrylate, urethane (meth)acrylate, etc. These multifunctional monomers can also be used as a mixture of one or more thereof. From the viewpoint of adhesiveness etc., the use amount of the multifunctional monomer is preferably 30 wt % or less based on the whole monomer components.

Preparation of the above acryl polymer can be performed by applying an appropriate method such as solution polymerization, emulsion polymerization, bulk polymerization, and suspension polymerization to a mixture of one or two or more kinds of component monomers, for example. Since the pressure-sensitive adhesive layer preferably has a composition in which the content of low molecular weight materials is suppressed from the viewpoint of prevention of wafer contamination, and since those in which an acryl polymer having a weight average molecular weight of 300,000 or more, particularly 400,000 to 3,000,000 is a main component are preferable from such a viewpoint, the pressure-sensitive adhesive can be made to be an appropriate cross-linking type with an internal cross-linking method, an external cross-linking method, and the like.

An external crosslinking agent can be appropriately adopted in the pressure-sensitive adhesive to increase the weight average molecular weight of the acrylic polymer or the like that is the base polymer. Specific examples of an external crosslinking method include a method of adding a so-called crosslinking agent such as a polyisocyanate compound, an epoxy compound, an aziridine compound, or a melamine crosslinking agent and reacting to the product. When the external crosslinking agent is used, the used amount is appropriately determined by a balance with the base polymer to be crosslinked and further by the application for the pressure-sensitive adhesive. Generally, it is about 5 parts by weight or less, and preferably 0.1 to 5 parts by weight to 100 parts by weight of the base polymer. Further, various conventionally known additives, such as a tackifier and an antioxidant, may be used in the pressure-sensitive adhesive other than the above-described components as necessary.

Examples of the radiation curable monomer component to be compounded include an urethane oligomer, urethane (meth)acrylate, trimethylolpropane tri(meth)acrylate, tetramethylolmethane tetra(meth)acrylate, pentaerythritol tri (meth)acrylate, pentaerythritol tetra(meth)acrylate, dipentaerythritol monohydroxypenta(meth)acrylate, dipentaerythritol hexa(meth)acrylate, and 1,4-butanediol di(meth) acrylate. Further, the radiation curable oligomer component includes various types of oligomers such as an urethane based, a polyether based, a polyester based, a polycarbonate based, and a polybutadiene based oligomer, and its molecular weight is appropriately in a range of about 100 to 30,000. The compounding amount of the radiation curable monomer component and the oligomer component can be appropriately determined to an amount in which the adhesive strength of the pressure-sensitive adhesive layer can be decreased depending on the type of the pressure-sensitive adhesive layer. Generally, it is for example 5 to 500 parts by weight, and preferably about 40 to 150 parts by weight based on 100 parts by weight of the base polymer such as an acryl polymer constituting the pressure sensitive adhesive.

Further, besides the added type radiation curable pressure-sensitive adhesive described above, the radiation curable pressure-sensitive adhesive includes an internal radiation curable pressure-sensitive adhesive using an acryl polymer having a radical reactive carbon-carbon double bond in the polymer side chain, in the main chain, or at the end of the main chain as the base polymer. The internal radiation curable pressure-sensitive adhesives of an internally provided type are preferable because they do not have to contain, and most do not contain, the oligomer component, or other component that is of a low molecular weight, and therefore they can form a pressure-sensitive adhesive layer having a stable layer structure without the oligomer component or other low molecular weight component migrating in the pressure sensitive adhesive over time.

The above-mentioned base polymer, which has a carbon-carbon double bond, may be any polymer that has a carbon-carbon double bond and further is viscous. As such a base polymer, a polymer having an acrylic polymer as a basic skeleton is preferable. Examples of the basic skeleton of the acrylic polymer include the acrylic polymers exemplified above.

The method for introducing a carbon-carbon double bond into any one of the above-mentioned acrylic polymers is not particularly limited, and may be selected from various methods. The introduction of the carbon-carbon double bond into a side chain of the polymer is easier in molecule design. The method is, for example, a method of copolymerizing a monomer having a functional group with an acrylic polymer, and then causing the resultant product to condensation-react or addition-react with a compound having a functional group reactive with the above-mentioned functional group and a carbon-carbon double bond while keeping the radiation curability of the carbon-carbon double bond.

Examples of the combination of these functional groups include a carboxylic acid group and an epoxy group; a carboxylic acid group and an aziridine group; and a hydroxyl group and an isocyanate group. Of these combinations, the combination of a hydroxyl group and an isocyanate group is preferable from the viewpoint of the easiness of reaction tracing. If the above-mentioned acrylic polymer, which has a carbon-carbon double bond, can be produced by the combination of these functional groups, each of the functional groups may be present on any one of the acrylic polymer and the above-mentioned compound. It is preferable for the above-mentioned preferable combination that the acrylic polymer has the hydroxyl group and the above-mentioned compound has the isocyanate group. Examples of the isocyanate compound in this case, which has a carbon-carbon double bond, include methacryloyl isocyanate, 2-methacryloyloxyethyl isocyanate, and m-isopropenyl-α,α-dimethylbenzyl isocyanate. The used acrylic polymer may be an acrylic polymer copolymerized with any one of the hydroxyl-containing monomers exemplified above, or an ether compound such as 2-hydroxyethyl vinyl ether, 4-hydroxybutyl vinyl ether or diethylene glycol monovinyl ether.

The intrinsic type radiation curable adhesive may be made only of the above-mentioned base polymer (in particular, the acrylic polymer), which has a carbon-carbon double bond. However, the above-mentioned radiation curable monomer component or oligomer component may be incorporated into the base polymer to such an extent that properties of the adhesive are not deteriorated. The amount of the radiation curable oligomer component or the like is usually 30 parts by weight or less, preferably from 0 to 10 parts by weight for 100 parts by weight of the base polymer.

The radiation curable pressure-sensitive adhesive preferably contains a photopolymerization initiator in the case of curing it with an ultraviolet ray or the like Examples of the photopolymerization initiator include α-ketol compounds such as 4-(2-hydroxyethoxy)phenyl(2-hydroxy-2-propyl)ketone, α-hydroxy-α,α'-dimethylacetophenone, 2-methyl-2-hydroxypropiophenone, and 1-hydroxycyclohexyl phenyl ketone; acetophenone compounds such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether compounds such as benzoin ethyl ether, benzoin isopropyl ether, and anisoin methyl ether; ketal compounds such as benzyl dimethyl ketal; aromatic sulfonyl chloride compounds such as 2-naphthalenesulfonyl chloride; optically active oxime compounds such as 1-phenyl-1,2-propanedione-2-(O-ethoxycarbonyl)oxime; benzophenone compounds such as benzophenone, benzoylbenzoic acid, and 3,3'-dimethyl-4-methoxybenzophenone; thioxanthone compound such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphorquinone; halogenated ketones; acylphosphonoxides; and acylphosphonates. The amount of the photopolymerization initiator to be blended is, for example, from about 0.05 to 20 parts by weight for 100 parts by weight of the acrylic polymer or the like which constitutes the adhesive as a base polymer.

Further, examples of the radiation curable pressure-sensitive adhesive which is used in the formation of the pressure-sensitive adhesive layer 2 include such adhesives as a rubber pressure-sensitive adhesive or an acryl pressure-sensitive adhesive which contains an addition-polymerizable compound having two or more unsaturated bonds, a photopolymerizable compound such as alkoxysilane having an epoxy group, and a photopolymerization initiator such as a carbonyl compound, an organic sulfur compound, a peroxide, an amine, and an onium salt compound, which are disclosed in JP-A No. 60-196956. Examples of the above addition-polymerizable compound having two or more unsaturated bonds include polyvalent alcohol ester or oligoester of acryl acid or methacrylic acid and an epoxy or a urethane compound.

The radiation curable pressure-sensitive adhesive layer 3 can contain a compound that is colored upon irradiation as necessary. By containing the compound that is colored upon irradiation in the radiation curable pressure-sensitive adhesive layer 3, only a portion irradiated with radiation can be colored. Whether the radiation curable pressure-sensitive adhesive layer 3 is irradiated or not can thus be visually determined right away.

The compound that colors upon irradiation is colorless or has a pale color before the irradiation. However, it is colored upon irradiation. A preferred specific example of the compound is a leuco dye. Common leuco dyes such as triphenylmethane, fluoran, phenothiazine, auramine, and spiropyran dyes can be preferably used. Specific examples thereof include 3-[N-(p-tolylamino)]-7-anilinofluoran, 3-[N-(p-tolyl)-N-methylamino]-7-anilinofluoran, 3-[N-(p-tolyl)-N-ethylamino]-7-anilinofluoran, 3-diethylamino-6-methyl-7-anilinofluoran, crystal violet lactone, 4,4',4"-trisdimethylaminotriphenylmethanol, and 4,4',4"-trisdimethylaminotriphenylmethane.

Examples of a developer that is preferably used with these leuco dyes include a prepolymer of a conventionally known phenolformalin resin, an aromatic carboxylic acid derivative, and an electron acceptor such as activated white earth, and various color developers can be used in combination for changing the color tone.

The compound that colors upon irradiation may be included in the radiation curable pressure-sensitive adhesive after being dissolved in an organic solvent or the like, or may be included in the pressure-sensitive adhesive in the form of a fine powder. The ratio of use of this compound is 10% by weight or less, preferably 0.01 to 10% by weight, and more preferably 0.5 to 5% by weight in the radiation curable pressure-sensitive adhesive layer 3. When the ratio of the compound exceeds 10% by weight, the curing of the radiation curable pressure-sensitive adhesive layer 3 becomes insufficient because the radiation onto the radiation curable pressure-sensitive adhesive layer 3 is absorbed too much by this compound, and the adhesive strength may not reduce sufficiently. On the other hand, the ratio of the compound is preferably 0.01% by weight or more to color the compound sufficiently.

The thickness of the radiation curable pressure-sensitive adhesive layer 3 is not particularly limited, and is preferably from about 10 to 100 μm, more preferably from 15 to 80 μm, and even more preferably from 20 to 50 μm. If the thickness is larger than the upper limit of the range, a solvent for formation by application remains and the remaining solvent is volatilized by heat in the process of producing the semiconductor devices such that the radiation curable pressure-sensitive adhesive layer 3 may be unfavorably peeled off. If the thickness is smaller than the lower limit of the range, the pressure-sensitive adhesive layer 3 does not deform sufficiently when the first thermosetting resin layer 1 is peeled, so that the pressure-sensitive adhesive layer 3 is not easily peeled.

(First Thermosetting Resin Layer)

The first thermosetting resin layer 1 of the present embodiment has a function of holding the semiconductor chips 5 and protecting the rear surfaces of the semiconductor chips 5 (second main surfaces 5b thereof, which are opposite to the first main surfaces 5a) when the semiconductor devices are each mounted onto a substrate. The constituting material of the first thermosetting resin layer 1 may be a combination of a thermoplastic resin with a thermosetting resin, or may be a thermoplastic resin alone or a thermosetting resin alone.

Examples of the thermoplastic resin include natural rubber, butyl rubber, isoprene rubber, chloroprene rubber, ethylene/vinyl acetate copolymer, ethylene/acrylic acid copolymer, ethylene/acrylic ester copolymer, polybutadiene resin, polycarbonate resin, thermoplastic polyimide resin, polyamide resins such as 6-nylon and 6,6-nylon, phenoxy resin, acrylic resin, saturated polyester resins such as PET and PBT, polyamideimide resin, and fluoropolymer resin. These thermoplastic resins may be used alone or in combination of two or more thereof. Of these thermoplastic resins, acrylic resin is particularly preferable since the resin contains ionic impurities in only a small amount and has a high heat resistance so as to make it possible to ensure the reliability of the semiconductor chip.

The acrylic resin is not limited to any special kind, and may be, for example, a polymer comprising, as a component or components, one or more esters of acrylic acid or methacrylic acid having a linear or branched alkyl group having 30 or less carbon atoms, in particular, 4 to 18 carbon atoms. Examples of the alkyl group include methyl, ethyl, propyl, isopropyl, n-butyl, t-butyl, isobutyl, amyl, isoamyl, hexyl, heptyl, cyclohexyl, 2-ethylhexyl, octyl, isooctyl, nonyl, isononyl, decyl, isodecyl, undecyl, lauryl, tridecyl, tetradecyl, stearyl, octadecyl, and eicosyl groups.

A different monomer which constitutes the above-mentioned polymer is not limited to any especial kind, and examples thereof include carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, and (4-hydroxymethylcyclohexyl)methyl acrylate; monomers which contain a sulfonic acid group, such as styrenesulfonic acid, allylsulfonic acid, 2-(meth)acrylamide-2-methylpropanesulfonic acid, (meth)acrylamidepropane sulfonic acid, sulfopropyl(meth)acrylate, and (meth)acryloyloxynaphthalenesulfonic acid; and monomers which contain a phosphoric acid group, such as 2-hydroxyethylacryloyl phosphate.

Examples of the above-mentioned thermosetting resin include phenol resin, amino resin, unsaturated polyester resin, epoxy resin, polyurethane resin, silicone resin, and thermosetting polyimide resin. These resins may be used alone or in combination of two or more thereof. Particularly preferable is epoxy resin, which contains ionic impurities which corrode semiconductor chips only a small amount. As the curing agent of the epoxy resin, phenol resin is preferable.

The epoxy resin may be any epoxy resin that is ordinarily used as an adhesive composition. Examples thereof include bifunctional or polyfunctional epoxy resins such as bisphenol A type, bisphenol F type, bisphenol S type, brominated bisphenol A type, hydrogenated bisphenol A type, bisphenol AF type, biphenyl type, naphthalene type, fluorene type, phenol Novolak type, orthocresol Novolak type, tris-hydroxyphenylmethane type, and tetraphenylolethane type epoxy resins; hydantoin type epoxy resins; tris-glycicylisocyanurate type epoxy resins; and glycidylamine type epoxy resins. These may be used alone or in combination of two or more thereof. Among these epoxy resins, particularly preferable are Novolak type epoxy resin, biphenyl type epoxy resin, tris-hydroxyphenylmethane type epoxy resin, and tetraphenylolethane type epoxy resin, since these epoxy resins are rich in reactivity with phenol resin as an agent for curing the epoxy resin and are superior in heat resistance and so on.

The phenol resin is a resin acting as a curing agent for the epoxy resin. Examples thereof include Novolak type phenol resins such as phenol Novolak resin, phenol aralkyl resin, cresol Novolak resin, tert-butylphenol Novolak resin and nonylphenol Novolak resin; resol type phenol resins; and polyoxystyrenes such as poly(p-oxystyrene). These may be used alone or in combination of two or more thereof. Among these phenol resins, phenol Novolak resin and phenol aralkyl resin are particularly preferable, since the connection reliability of the semiconductor device can be improved.

In regards to the blend ratio between the epoxy resin and the phenol resin, for example, the phenol resin is blended with the epoxy resin in such a manner that the hydroxyl groups in the phenol resin is preferably from 0.5 to 2.0 equivalents, more preferably from 0.8 to 1.2 equivalents per equivalent of the epoxy groups in the epoxy resin component. If the blend ratio between the two is out of this range, the curing reaction therebetween does not advance sufficiently so that properties of the cured epoxy resin easily deteriorate.

In the present invention, a thermosetting resin comprising the epoxy resin, the phenol resin, and an acrylic resin is particularly preferable. Since these resins contain only a small amount of ionic impurities and have high heat resistance, the reliability of the semiconductor chip can be ensured. In regards to the blend ratio in this case, the amount of the mixture of the epoxy resin and the phenol resin is from 10 to 200 parts by weight for 100 parts by weight of the acrylic resin component.

The thermal curing accelerator catalyst for the epoxy resin and the phenol resin is not especially limited, and it is appropriately selected from known thermal curing accelerator catalysts. The thermal curing accelerator catalyst can be used alone or two types or more of them can be used in combination. Examples of the thermal curing accelerator catalyst that can be used include an amine curing accelerator, a phosphorus curing accelerator, an imidazole curing accelerator, a boron curing accelerator, and a phosphorus-boron curing accelerator.

In order to crosslink the constituents of the first thermosetting resin layer of the present invention to some extent in advance, it is preferable to add, as a crosslinking agent, a polyfunctional compound which reacts with functional groups of molecular chain terminals of the above-mentioned polymer to the materials used when the sheet 12 is produced. In this way, the adhesive property of the sheet at high temperatures is improved so as to improve the heat resistance.

The crosslinking agent may be one known in the prior art. Particularly preferable are polyisocyanate compounds, such as tolylene diisocyanate, diphenylmethane diisocyanate, p-phenylene diisocyanate, 1,5-naphthalene diisocyanate, and adducts of polyhydric alcohol and diisocyanate. The amount of the crosslinking agent to be added is preferably set to 0.05 to 7 parts by weight for 100 parts by weight of the above-mentioned polymer. If the amount of the crosslinking agent to be added is more than 7 parts by weight, the adhesive force is unfavorably lowered. On the other hand, if the adding amount is less than 0.05 parts by weight, the cohesive force is unfavorably insufficient. A different polyfunctional compound, such as an epoxy resin, together with the polyisocyanate compound may be incorporated if necessary.

Further, an inorganic filler can be appropriately incorporated into the first thermosetting resin layer 1. By incorporation of the inorganic filler, electric conductivity may be imparted, thermal conductivity may be improved, and the storage modulus may be adjusted.

Examples of the inorganic fillers include various inorganic powders made of the following: a ceramic such as silica, clay, plaster, calcium carbonate, barium sulfate, aluminum oxide, beryllium oxide, silicon carbide or silicon nitride; a metal such as aluminum, copper, silver, gold, nickel, chromium, lead, tin, zinc, palladium or solder, or an alloy thereof; and carbon. These may be used alone or in combination of two or more thereof. Among these, silica, in particular fused silica, is preferably used.

The average particle size of the inorganic filler is preferably within a range of 0.1 to 5 μm, and more preferably within a range of 0.2 to 3 μm. When the average particle size of the inorganic filler is less than 0.1 μm, it becomes difficult to make Ra of the first thermosetting resin layer be 0.15 μm or more. On the other hand, when the average particle size exceeds 5 μm, it becomes difficult to make Ra less than 1 μm. In the present invention, two or more types of inorganic fillers having a different average particle size may be used in combination. The value of the average particle size is obtained using a luminous intensity type particle size distribution meter (manufactured by HORIBA, Ltd., device name: LA-910).

The blend amount of the inorganic filler is preferably set to 20 to 80 parts by weight to 100 parts weight of the organic resin component. It is especially preferably 20 to 70 parts by weight. If the blend amount of the inorganic filler is less than 20 parts by weight, the contact area between the radiation curable pressure-sensitive adhesive layer 3 and the first thermosetting resin layer 1 becomes large so that the two may not be easily peeled from each other. If the blend amount is more than 80 parts by weight, the contact area conversely becomes too small so that the two may be unintentionally peeled from each other in the process of producing the semiconductor devices.

If necessary, other additives besides the inorganic filler may be incorporated into the first thermosetting resin layer 1 of the present invention. Examples thereof include a flame retardant, a silane coupling agent, and an ion trapping agent. Examples of the flame retardant include antimony trioxide, antimony pentaoxide, and brominated epoxy resin. These may be used alone or in combination of two or more thereof. Examples of the silane coupling agent include β-(3,4-epoxy-cyclohexyl)ethyltrimethoxysilane, γ-glycidoxypropyltrimethoxysilane, and γ-glycidoxypropylmethyldiethoxysilane. These may be used alone or in combination of two or more thereof. Examples of the ion trapping agent include hydrotalcite and bismuth hydroxide. These may be used alone or in combination of two or more thereof.

The first thermosetting resin layer 1 preferably has a lowest melt viscosity in the range of $5 \times 10^2$ Pa·s or more and $1 \times 10^4$ Pa·s or less at a temperature of 50 to 200° C. In a case where the first thermosetting resin layer 1 has a lowest melt viscosity in this range, at the time of the laminating of the second thermosetting resin layer 2 on the first thermosetting resin layer 1, the semiconductor chips 5 arranged on the first thermosetting resin layer 1 can be prevented from being shifted out of position. Further, in a case where the first thermosetting resin layer 1 has the above-described lowest melt viscosity, the radiation curable pressure-sensitive adhesive layer 3 and the first thermosetting resin layer 1 can easily be peeled from each other at the interface between the radiation curable pressure-sensitive adhesive layer 3 and the first thermosetting resin layer 1 after the formation of the second thermosetting resin layer 2.

The thickness of the first thermosetting resin layer 1 (the thickness is, when the first thermosetting resin layer is composed of plural layers, the total thickness) is not particularly limited. The thickness is preferably in the range of 5 μm or more and 250 μm or less in consideration of the performance of holding the semiconductor chips 5, and a matter that the semiconductor chips 5 should be certainly protected after the first thermosetting resin layer 1 is cured.

The first thermosetting resin layer is preferably colored. This makes it possible to cause the semiconductor devices to exhibit excellent marking properties and external appearance. Thus, the semiconductor chips having value-added external appearances can be obtained. The colored first thermosetting resin layer has excellent marking performance as described herein; thus, when a marking method that may be of various types, such as a printing or laser marking method, is applied, through the aid of the colored first thermosetting resin layer, to non-circuit surfaces (that is, the second main surfaces 5b) of the semiconductor chips or the semiconductor devices wherein the semiconductor chips are used, the semiconductor devices can be marked so that various pieces of information, such as character or graphic information pieces, can be given to the devices. In particular, by controlling the color of the colored layer, information pieces given by the marking (such as character or graphic information pieces) can be observed with excellent visibility. Further, when the first thermosetting resin layer is colored, the radiation curable pressure-sensitive adhesive layer and the first thermosetting resin layer can easily be distinguished from each other, improving in workability and other properties. Furthermore, it is possible to color different product, i.e., semiconductor devices, in different colors. When the first thermosetting resin layer is rendered a colored layer, which is not transparent and colorless, the color of the colored layer is not particularly limited. Preferred examples thereof include deep colors such as black, blue, and red. A particularly preferred example thereof is black.

In the present embodiment, deep colors basically mean colors each permitting L* specified in the L*a*b* color coordinate system to be 60 or less (0 to 60), preferably 50 or less (0 to 50), more preferably 40 or less (0 to 40).

Black means any black based color permitting L* specified in the L*a*b* color coordinate system to be 35 or less (0 to 35), preferably 30 or less (0 to 30), more preferably 25 or less (0 to 25). In regards to the black, a* and b* specified in the L*a*b* color coordinate system may each be appropriately selected in accordance with the value of L*. For example, the value of each of a* and b* is preferably from −10 to 10, more preferably from −5 to 5, even more preferably from −3 to 3 (in particular preferably 0, or about 0).

In the present embodiment, L*, a* and b* specified in the L*a*b* color coordinate system may be analyzed by making a measurement using a color-difference meter (trade name: "CR-200", manufactured by Minolta Co., Ltd.). The L*a*b* color coordinate system is a color space recommended by the International Commission on Illumination (CIE) in 1976, and denotes a color space named the CIE 1976 (L*a*b*) color coordinate system. The L*a*b* color coordinate system is also prescribed in JIS Z 8729 according to the Japanese Industrial Standard.

When the first thermosetting resin layer is colored, a color material (coloring agent) may be used in accordance with a target color. Such color materials are preferably black based color materials, blue based color materials, red based color materials, and other various deep color based color materials, and are in particular preferably black based color materials. The color material to be used may be a pigment, a dye or some other. Regarding the color material, a single species thereof, or a combination of two or more species thereof may be used. The dye is not particularly limited, and may be any one of acid dyes, reactive dyes, direct dyes, dispersed dyes, and cationic dyes and other dyes. The pigment is not particularly limited, either, and may be appropriately selected from known pigments.

Particularly, in the case of using a dye as the color material, the dye turns into the state of being evenly dissolved or dispersed in the first thermosetting resin layer. For this reason, the first thermosetting resin layer can easily be produced to have an even or substantially even color density. Thus, when a dye is used as the color material, the color density of the first thermosetting resin layer can be made even or substantially even, so that the semiconductor devices can be improved in marking property or external appearance.

The black based color material to be used is not particularly limited, and may be selected from inorganic black based pigments and black based dyes. The black based color material may be a color material mixture wherein a cyan based color material (bluish green based color material), a magenta based color material (reddish purple color material), and a yellow based color material are mixed with each other. In regards to the black based color material, a single species thereof, or a combination of two or more species thereof may be used. Of course, the black based color material may be used together with a color material having a color other than black.

Specific examples of the black based color material include carbon blacks (such as furnace black, channel black, acetylene black, thermal black, and lamp black), graphite, copper oxide, manganese dioxide, azo pigments (such as azomethine azo black), aniline black, perylene black, titanium black, cyanine black, activated carbon, ferrites (such as nonmagnetic ferrite, and magnetic ferrite), magnetite, chromium oxide, iron oxide, molybdenum disulfide, chromium complexes, complex oxide based black colorants, and anthraquinone based organic black colorants.

Other examples of the black based color material usable in the present embodiment include C.I. Solvent Blacks 3, 7, 22, 27, 29, 34, 43 and 70, C.I. Direct Blacks 17, 19, 22, 32, 38, 51 and 71, C.I. Acid Blacks 1, 2, 24, 26, 31, 48, 52, 107, 109, 110, 119 and 154, C.I. Disperse Blacks 1, 3, 10 and 24, and other black based dyes; and C.I. Pigment Blacks 1 and 7, and other black based pigments.

As such a black based color material, the following are commercially available: color materials (trade names: "Oil Black BY", "Oil Black BS", "Oil Black HBB", "Oil Black 803", "Oil Black 860", "Oil Black 5970", "Oil Black 5906", and "Oil Black 5905") manufactured by Orient Chemical Industries Ltd.; and others.

Examples of color materials other than black based color materials include cyan based color materials, magenta based color materials, and yellow based color materials. Examples of the cyan based color materials include C.I. Solvent Blues 25, 36, 60, 70, 93 and 95, C.I. Acid Blues 6 and 45, and other cyan based dyes; and C.I. Pigment Blues 1, 2, 3, 15, 15:1, 15:2, 15:3, 15:4, 15:5, 15:6, 16, 17, 17:1, 18, 22, 25, 56, 60, 63, 65 and 66, C.I. Vat Blues 4 and 60, C.I. Pigment Green 7, and other cyan based pigments.

Examples of the magenta based color materials include magenta based dyes such as C.I. Solvents Reds 1, 3, 8, 23, 24, 25, 27, 30, 49, 52, 58, 63, 81, 82, 83, 84, 100, 109, 111, 121 and 122; C.I. Disperse Red 9; C.I. Solvent Violets 8, 13, 14, 21 and 27; C.I. Disperse Violet 1; C.I. Basic Reds 1, 2, 9, 12, 13, 14, 15, 17, 18, 22, 23, 24, 27, 29, 32, 34, 35, 36, 37, 38, 39 and 40; C.I. Basic Violets 1, 3, 7, 10, 14, 15, 21, 25, 26, 27 and 28.

Other examples of the magenta based color materials include magenta based pigments such as C.I. Pigment Reds 1, 2, 3, 4, 5, 6, 7, 8, 9, 10, 11, 12, 13, 14, 15, 16, 17, 18, 19, 21, 22, 23, 30, 31, 32, 37, 38, 39, 40, 41, 42, 48:1, 48:2, 48:3, 48:4, 49, 49:1, 50, 51, 52, 52:2, 53:1, 54, 55, 56, 57:1, 58, 60, 60:1, 63, 63:1, 63:2, 64, 64:1, 67, 68, 81, 83, 87, 88, 89, 90, 92, 101, 104, 105, 106, 108, 112, 114, 122, 123, 139, 144, 146, 147, 149, 150, 151, 163, 166, 168, 170, 171, 172, 175, 176, 177, 178, 179, 184, 185, 187, 190, 193, 202, 206, 207, 209, 219, 222, 224, 238 and 245; C.I. Pigment Violets 3, 9, 19, 23, 31, 32, 33, 36, 38, 43 and 50; and C.I. Vat Reds 1, 2, 10, 13, 15, 23, 29 and 35.

Examples of the yellow based color materials include yellow based dyes such as C.I. Solvent Yellows 19, 44, 77, 79, 81, 82, 93, 98, 103, 104, 112 and 162; and yellow based pigments such as C.I. Pigment Oranges 31 and 43, and C.I. Pigment Yellows 1, 2, 3, 4, 5, 6, 7, 10, 11, 12, 13, 14, 15, 16, 17, 23, 24, 34, 35, 37, 42, 53, 55, 65, 73, 74, 75, 81, 83, 93, 94, 95, 97, 98, 100, 101, 104, 108, 109, 110, 113, 114, 116, 117, 120, 128, 129, 133, 138, 139, 147, 150, 151, 153, 154, 155, 156, 167, 172, 173, 180, 185 and 195; and C.I. Vat Yellows 1, 3 and 20.

Color materials of various kinds, such as the cyan based color materials, the magenta based color materials or the yellow based color materials, may be used alone or in combination of two or more thereof. When the color materials, such as the cyan based color materials, the magenta based color materials or the yellow based color materials, are used in combination of two or more thereof, the mixing ratio between the two or more (or the blend ratio of each of the two or more) is not particularly limited, and may be appropriately selected in accordance with the individual species of the color materials, a target color, and others.

When the first thermosetting resin layer 1 is colored, the form of coloring is not particularly limited. The first thermosetting resin layer 1 may be, for example, in the form of a mono-layered film to which a coloring agent is added, or in the form of a laminated film having a resin layer at least made of a thermosetting resin and a coloring agent layer laminated thereon. When the first thermosetting resin layer 1 is a laminated film having a resin layer and a coloring agent layer, the first thermosetting resin layer 1 is preferably in the lamination form of "resin layer/color material layer/resin layer". In this case, the two resin layers on both sides of the coloring agent layer may be resin layers having the same composition, or resin layers having different compositions.

(Method for Forming the Supporting Structure)

A method for forming the supporting structure used in the present embodiment includes the step of laminating the radiation curable pressure-sensitive adhesive layer 3 onto the support 4, and the step of laminating the first thermosetting resin layer 1 onto the radiation curable pressure-sensitive adhesive layer 3.

First, the support 4 is prepared. For example, a glass support as the support 4 may be a commercially available product, or may be a support 4 of a predetermined shape that is obtained by subjecting a glass plate having a predetermined thickness to cutting or some other treatment. When the support 4 is made of resin, examples of a method for forming a film thereon include calendar film-forming method, a casting method in an organic solvent, an inflation extruding method in a closed system, a T-die extruding method, a co-extruding method, and a dry laminating method. Hereinafter, the supporting-structure-forming method will be described in regards to a case wherein the support 4 made of glass is used.

The radiation curable pressure-sensitive adhesive layer 3 may be formed by coating a solution of a radiation curable pressure-sensitive adhesive composition onto a release film, drying the workpiece under predetermined conditions (and optionally crosslinking a crosslinkable component therein by heat) to form a coating film, and then transferring this coating film onto the support 4. The coating method is not especially limited, and examples thereof include roll coating, screen coating, and gravure coating. The coating thickness is appropriately set so that the thickness of the radiation curable pressure-sensitive adhesive layer 3 that can be eventually obtained by drying the coating layer falls within a range of 10 to 100 μm. The viscosity of the pressure-sensitive adhesive composition solution is not especially limited. However, it is preferably 100 to 5000 mPa·s, and more preferably 200 to 3000 mPa·s at 25° C.

The method of drying the coating layer is not especially limited. However, it is preferably dried without using a dry wind when forming a pressure-sensitive adhesive layer having a flat surface, for example. The drying time can be appropriately set according to the application amount of the pressure-sensitive adhesive composition solution; it is normally within a range of 0.5 to 5 min, and preferably within a range of 2 to 4 min. The drying temperature is not especially limited; it is normally 80 to 150° C., and preferably 80 to 130° C.

The radiation curable pressure-sensitive adhesive layer 3 may be formed by coating a pressure-sensitive adhesive composition directly onto the support 4 to form a coating film thereof, and then drying the coating film under the above-described drying conditions.

The release film is not especially limited. However, an example thereof is a film in which a release coating layer such as a silicone layer is formed on the surface of the release film which is pasted onto the radiation curable pressure-sensitive adhesive layer 3 on the support. Examples of the support of the release film include paper such as glassine paper and a resin film made of polyethylene, polypropylene, or polyester such as polyethylene terephthalate (PET).

Next, the radiation curable pressure-sensitive adhesive layer 3 on the release film is transferred onto the support 4. The transferring is attained by pressure bonding. The bonding temperature is usually from 25 to 100° C., preferably from 25 to 50° C. The bonding pressure is usually from 0.1 to 0.6 Pa, preferably from 0.2 to 0.5 Pa.

The method for forming the first thermosetting resin layer 1 may be, for example, a method of coating, onto a release film 12a, a solution of an adhesive composition that is a constituting material of the first thermosetting resin layer 1 to form a coating film, and then drying the coating film (see FIG. 1A). The release film 12a may be the same release film as described above.

The method of applying the adhesive composition solution is not especially limited. However, an example is a method of applying the solution using a comma coating method, a fountain method, a gravure method, or the like. The application thickness is appropriately set so that the thickness of the first thermosetting resin layer 1 that can be eventually obtained by drying the coating layer falls within a range of 5 to 250 μm. The viscosity of the adhesive composition solution is not especially limited. However, it is preferably 400 to 2500 mPa·s, and more preferably 800 to 2000 mPa·s at 25° C.

The drying of the coating layer is performed by blowing a dry wind over the coating layer. Examples of the method of blowing a dry wind include a method of blowing a dry wind so that the direction of blowing becomes parallel to the direction of transporting the release film and a method of blowing a dry wind so that the direction of blowing becomes perpendicular to the surface of the coating layer. The flow of the dry wind is not especially limited, and it is normally 5 to 20 m/min, and preferably 5 to 15 m/min. With the flow of the dry wind being 5 m/min or more, the drying of the coating layer is prevented from becoming insufficient. On the other hand, with the flow of the dry wind being 20 m/min or less, the concentration of the organic solvent in the vicinity of the surface of the coating layer becomes uniform, and therefore, evaporation of the solvent can be made uniform. As a result, a first thermosetting resin layer 1 having a uniform surface can be formed.

The drying time is appropriately set according to the applied thickness of the adhesive composition solution; it is normally within a range of 1 to 5 min, and preferably within a range of 2 to 4 min. When the drying time is less than 1 min, the curing reaction does not proceed sufficiently, and the amount of unreacted curing component and the amount of the remained solvent becomes large. Accordingly, problems of outgassing and voids may occur in the subsequent steps. On the other hand, when it exceeds 5 min, the curing reaction proceeds too much. As a result, fluidity, and tackiness to the semiconductor wafer may deteriorate.

The drying temperature is not especially limited, and it is normally set within a range of 70 to 160° C. However, the drying temperature is preferably increased stepwise with the passage of the drying time in the present embodiment. Specifically, it is set within a range of 70 to 100° C. at an initial stage of the drying (1 min or less from immediately after the start of the drying), and it is set within a range of 100 to 160° C. at a late stage of the drying (more than 1 min to 5 min or less) for example. Accordingly, pin holes on the surface of the coating layer that form when the drying temperature is rapidly increased right after the start of the coating can be prevented.

Subsequently, the first thermosetting resin layer 1 is transferred onto the radiation curable pressure-sensitive adhesive layer 3 (see FIG. 1B). The transferring can be attained by a known method such as laminating or pressing. The temperature for bonding the first thermosetting resin layer onto the radiation curable pressure-sensitive adhesive layer is preferably from room temperature to 150° C. In order to restrain the advance of curing reaction in the first thermosetting resin layer 1, the temperature is more preferably from room temperature to 100° C. The bonding pressure is from 0.5 to 50 MPa, preferably from 0.5 to 10 MPa.

The first thermosetting resin layer 1 may be formed by coating an adhesive composition solution directly onto the radiation curable pressure-sensitive adhesive layer 3 to form a coating film thereof, and then drying the coating film under the above-described drying conditions.

The above-described release film 12a may be peeled after the first thermosetting resin layer 1 is bonded onto the radiation curable pressure-sensitive adhesive layer 3, or may be used, as it is, as a protecting film for the supporting structure 10 and then peeled when the semiconductor chips are to be arranged onto the first thermosetting resin layer 1. In this way, the supporting structure 10 of the present embodiment can be produced.

[Semiconductor Chip Arranging Step]

Figure 2A:
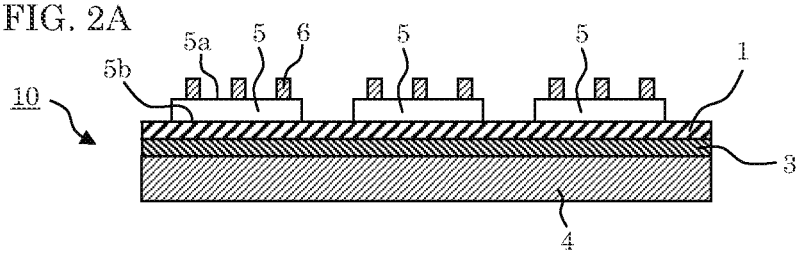
FIGS. 2A to 2G are schematic sectional views that respectively illustrate steps of the method for producing a semiconductor device according to an embodiment of the invention.

In a semiconductor chip arranging step, the semiconductor chips 5 are arranged onto the first thermosetting resin layer 1 so that the first thermosetting layer 1 and the second main surface 5b opposite to the first main surfaces 5a of the semiconductor chips 5 face each other (see FIG. 2A). For the arrangement of the semiconductor chips 5, a known apparatus, such as a flip chip bonder or a die bonder, may be used.

The layout of the arrangement of the semiconductor chips 5, and the number of the chips 5 to be arranged may be appropriately set in accordance with the shape and the size of the supporting structure 10, the number of the target semiconductor devices to be produced, and others. The chips 5 may be arranged into the form of a matrix having plural rows and plural columns.

[Second Thermosetting Resin Layer Laminating Step]

Figure 2B:
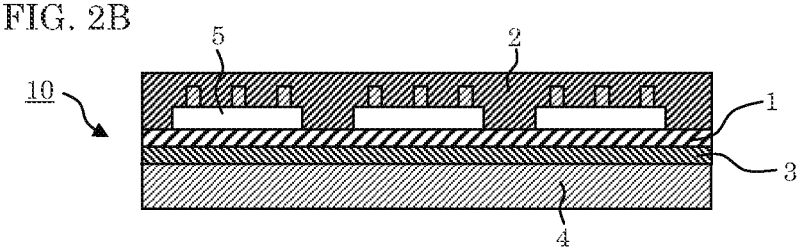

In a second thermosetting resin layer laminating step, a second thermosetting resin layer 2 is laminated on the first thermosetting resin layer 1 to cover the semiconductor chips 5 (see FIG. 2B). This second thermosetting resin layer 2 functions as a sealing resin for protecting the semiconductor chips 5 and elements attached thereto from the external environment.

The method for laminating the second thermosetting resin layer 2 is not particularly limited, and examples thereof include a method of extruding a melted and kneaded product of a resin composition for forming the second thermosetting resin layer, placing the extruded product onto the first thermosetting resin layer 1, and then pressing the workpiece to attain the formation and the laminating of the second thermosetting resin layer at a time; a method of coating a resin composition for the second thermosetting resin layer onto the first thermosetting resin layer 1, and then drying the workpiece; and a method of coating the same resin composition onto a release treatment sheet, drying the resultant coating film to form the sheet-like second thermosetting resin layer 2, and further transferring the second thermosetting resin layer 2 onto the first thermosetting resin layer 1.

In the present embodiment, the second thermosetting resin layer 2 is preferably a sheet-like thermosetting resin layer. When the second thermosetting resin layer 2 is made in a sheet-like state (the sheet-like second thermosetting resin layer may be referred to as the "sheet-like second resin layer" hereinafter), the semiconductor chips 5 can be buried only by bonding the second thermosetting resin layer 2 onto the first thermosetting resin 1 in order to cover the semiconductor chips 5. Thus, the production efficiency of the semiconductor devices can be improved. In this case, the second thermosetting resin layer 2 can be laminated onto the first thermosetting resin layer 1 by a known method, such as hot pressing, or laminating using a laminator. In regards to conditions for the hot pressing, the temperature is, for example, from 40 to 120° C., preferably from 50 to 100° C., the pressure is, for example, from 50 to 2,500 kPa, preferably from 100 to 2,000 kPa, and the period is, for example, from 0.3 to 10 minutes, preferably from 0.5 to 5 minutes. Considering improvements in the adhesiveness and followability of the second thermosetting resin layer 2 onto the semiconductor chips 5, the pressing is performed preferably under a reduced pressure (for example, a pressure of 10 to 2,000 Pa).

In this way, the second thermosetting resin layer 2 is laminated on the first thermosetting resin layer 1, and subsequently the two are cured. The curing of the second thermosetting resin layer and the first thermosetting resin layer is attained by heating into the range of temperatures of 120 to 190° C. under a pressure of 0.1 to 10 MPa for a heating period of 1 to 60 minutes.

The curing of the second thermosetting resin layer and the first thermosetting resin layer may be performed before or after the radiation curable pressure-sensitive adhesive layer and the first thermosetting resin layer 1 are peeled from each other. Before the peeling, the curing may be advanced into some degree and then completed after the peeling.

(Second Thermosetting Resin Layer)

A resin composition for forming the second thermosetting resin layer is not particularly limited as far as the composition can be used to seal the semiconductor chips. A preferred example thereof is an epoxy resin composition comprising the following components A to E:

component A: an epoxy resin,
component B: a phenolic resin,
component C: an elastomer, component D: an inorganic filler, and
component E: a curing accelerator.
(Component A)

The epoxy resin (component A) is not particularly limited, and examples thereof include triphenyl methane, cresol novolak, biphenyl, modified bisphenol A, bisphenol A, bisphenol F, modified bisphenol F, dicyclopentadiene, phenol novolak, phenoxy resin, and other various types of epoxy resins. These epoxy resins may be used alone or in combination of two or more thereof.

The epoxy resin is preferably an epoxy resin which is in a solid form at room temperature, and has an epoxy equivalent of 150 to 250 and a softening point or melting point of 50 to 130° C. in order to certainly secure a reactivity and a toughness after being cured. Particularly preferred are triphenylmethane, cresol novolak, and biphenyl type epoxy resins, from the viewpoint of the reliability.

The epoxy resin is preferably modified bisphenol A type epoxy resin which has a flexible skeleton such as an acetal group or a polyoxyalkylene group, from the viewpoint of a low stress property thereof. The epoxy resin is in particular preferably modified bisphenol A type epoxy resin which has an acetal group because the resin is in a liquid form and is good in its handling property.

The content by percentage of the epoxy resin (component A) is preferably set into the range of 1 to 10% by weight of the epoxy resin composition.
(Component B)

The phenolic resin (component B) is not particularly limited as far as the resin causes a curing reaction with the epoxy resin (component A). Examples thereof include phenol novolak resin, phenol aralkyl resin, biphenyl aralkyl resin, dicyclopentadiene type phenolic resin, cresol novolak resin, and resol resin. These phenolic resins may be used alone or in combination of two or more thereof.

The phenolic resin is preferably a resin having a hydroxyl equivalent of 70 to 250 and a softening point of 50 to 110° C. from the viewpoint of the reactivity thereof with the epoxy resin (component A). The phenolic resin is in particular preferably phenol novolak resin because the resin is high in curing reactivity. Moreover, from the viewpoint of the reliability, the phenolic resin is a low-hygroscopicity phenolic resin such as phenol aralkyl resin or biphenyl aralkyl resin can be preferably used.

In regards to the blend ratio between the epoxy resin (component A) and the phenolic resin (component B), the amount of the hydroxyl groups in the phenolic resin (component B) is preferably from 0.7 to 1.5 equivalents, more preferably 0.9 to 1.2 equivalents per equivalent of epoxy groups in the epoxy resin (component A), from the viewpoint of the curing reactivity therebetween.
(Component C)

The elastomer (component C) used together with the epoxy resin (component A) and the phenolic resin (component B) is a component for giving the epoxy resin composition a flexibility necessary for sealing the semiconductor chips 5 when the second thermosetting resin layer is made into a sheet-like state. The structure thereof is not particularly limited as far as the elastomer produces such an effect. Examples thereof include various acrylic copolymers such as polyacrylate, styrene/acrylate copolymers, butadiene rubber, styrene/butadiene rubber (SBR), ethylene/vinyl acetate copolymer (EVA), isoprene rubber, acrylonitrile rubber, and other rubbery polymers. The component C is in particular preferably acrylic copolymer because the copolymer is easily dispersed into the epoxy resin (component A) and is further high in reactivity with the epoxy resin (component A) so that the copolymer can improve the resultant second thermosetting resin layer in heat resistance and strength. These elastomers may be used alone or in combination of two or more thereof.

Acrylic copolymer may be synthesized, for example, by subjecting an acrylic monomer mixture where the ratio between the monomers is set to a predetermined value for radical polymerization in a usual way. The method for the radical polymerization may be a solution polymerization, wherein an organic solvent is used, or a suspension polymerization, wherein monomers as raw materials are polymerized while dispersed. At this time, a polymerization initiator may be used, and examples thereof include 2,2'-azobisisobutyronitrile, 2,2'-azobis-(2,4-dimethylvaleronitrile), 2,2'-azobis-4-methoxy-2,4-dimethylvaleronitrile, and other azo or diazo polymerization initiators; and benzoyl peroxide, methyl ethyl ketone peroxide, and other peroxide polymerization initiators. In the suspension polymerization, it is desired to add a dispersing agent, such as polyacrylamide or polyvinyl alcohol, to the system.

The content by percentage of the elastomer (component C) is from 15 to 30% by weight of the whole of the epoxy resin composition. If the content by percentage of the elastomer (component C) is less than 15% by weight, the sheet-like second resin layer 2 does not easily gain flexibility or plasticity. Furthermore, it is difficult to seal with the resin while restraining warping of the second thermosetting resin layer. Conversely, if the content by percentage is more than 30% by weight, the sheet-like second resin layer 2 is raised in melt viscosity to be lowered in performance of burying the semiconductor chips 5 therein. Additionally, the cured product of the sheet-like second resin layer 2 tends to decline in strength and heat resistance.

The ratio by weight of the elastomer (component C) to the epoxy resin (component A) is preferably set into the range of 3 to 4.7. If this ratio by weight is less than 3, the fluidity of the sheet-like second resin layer 2 is not easily controlled. If the ratio is more than 4.7, the sheet-like second resin layer 2 tends to be poor in tackiness onto the semiconductor chips 5.
(Component D)

The inorganic filler (component D) is not particularly limited, and may be various fillers known in the prior art. Examples thereof include quartz glass, talc, silica (such as fused silica or crystalline silica), alumina, aluminum nitride, silicon nitride, and some-other-material powders. These fillers may be used alone or in combination of two or more thereof.

The inorganic filler is in particular preferably silica powder because the cured product of the epoxy resin composition is decreased in linear thermal expansion coefficient, which decreases internal stresses in the cured product so that after the sealing of the semiconductor chips 5, the second thermosetting resin layer 2 can be inhibited from warping. Out of silica powder species, fused silica powder is more preferred. Examples of the fused silica powder include spherical fused silica powder, and crashed fused silica powder. From the viewpoint of fluidity, spherical fused silica powder is particularly preferred. The average particle diameter thereof is preferably from 0.1 to 30 μm, in particular preferably from 0.3 to 15 μm.

The average particle diameter may be gained, for example, by measurement using a laser diffraction scattering type particle size distribution measuring device on a sample extracted arbitrarily from a population of the particles.

The content by percentage of the inorganic filler (component D) is preferably from 50 to 90% by weight, more preferably from 55 to 90% by weight, even more preferably from 60 to 90% by weight of the whole of the epoxy resin composition. If the content by percentage of the inorganic filler (component D) is less than 50% by weight, the cured product of the epoxy resin composition is increased in linear thermal expansion coefficient so that the second thermosetting resin layer 2 tends to be largely warped. On the other hand, if the content by percentage is more than 90% by weight, the second thermosetting resin layer 2 is deteriorated in flexibility or fluidity so that the second thermosetting resin layer 2 tends to be reduced in tackiness to the semiconductor chips 5.

(Component E)

The curing accelerator (component E) is not particularly limited as far as the component advances the curing of the epoxy resin and the phenolic resin. From the viewpoint of curing performance and storability, preferred examples of the component E include organic phosphorous compounds such as triphenylphosphine and tetraphenylphosphonium tetraphenylborate, and imidazole compounds. These curing accelerators may be used alone or together with another curing accelerator.

The content of the curing accelerator (component E) is preferably from 0.1 to 5 parts by weight for 100 parts by weight of the total of the epoxy resin (component A) and the phenolic resin (component B).

(Other Components)

Besides the components A to E, a flame retardant component may be incorporated into the epoxy resin composition. The flame retardant component may be various metal hydroxides such as aluminum hydroxide, magnesium hydroxide, iron hydroxide, calcium hydroxide, tin hydroxide, or any complexed metal hydroxide. Preferred is aluminum hydroxide or magnesium hydroxide, and particularly preferred is aluminum hydroxide from the viewpoint of costs and an advantage that the metal hydroxide can exhibit flame retardancy in a relatively small addition amount thereof.

The average particle diameter of the metal hydroxide is preferably from 1 to 10 μm, more preferably from 2 to 5 μm because the diameter permits the epoxy resin composition to keep an appropriate fluidity certainly when the composition is heated. If the average particle diameter of the metal hydroxide is less than 1 μm, the metal hydroxide cannot be evenly dispersed in the epoxy resin composition with ease, and further tends not to permit the epoxy resin composition to gain a sufficient fluidity when the composition is heated. If the average particle diameter is more than 10 μm, the surface area of the metal hydroxide (component E) per addition amount thereof is small so that the flame retardant effect tends to be reduced.

As the flame retardant component, a phosphazene compound may be used besides the metal hydroxides. The phosphazene compound may be obtained as a commercially available product, examples of which include products (trade names: for example, SPR-100, SA-100, and SP-100) each manufactured by Otsuka Chemical Co., Ltd., and products (trade names: for example, FP-100, and FP-110) each manufactured by Fushimi Pharmaceutical Co., Ltd.

The phosphazene compound is preferably a phosphazene compound represented by the following formula (1) or (2) because the compound produces a flame retardant effect even in a small amount:

[Formula 1]

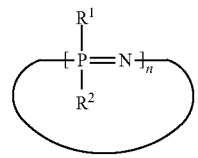

(1)

wherein, in the formula (1), n is an integer of 3 to 25, $R^1$s and $R^2$s, which may be the same or different, are each a monovalent organic group having a functional group selected from the group consisting of alkoxy, phenoxy, amino, hydroxyl and allyl groups; or

[Formula 2]

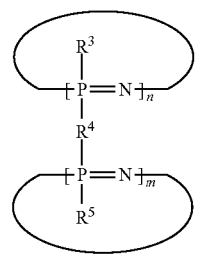

(2)

wherein, in the formula (2), n and m are each independently an integer of 3 to 25; $R^3$s and $R^5$s, which may be the same or different, are each a monovalent organic group having a functional group selected from the group consisting of alkoxy, phenoxy, amino, hydroxyl and ally groups; and $R^4$ is a bivalent organic group having a functional group selected from the group consisting of alkoxy, phenoxy, amino, hydroxyl and allyl groups. The content by percentage of the phosphorous element in the phosphazene compounds is preferably 12% or more by weight.

It is preferred to use a cyclic phosphazene oligomer represented by the following formula (3) from the viewpoint of the stability thereof and the restrain of the generation of voids:

[Formula 3]

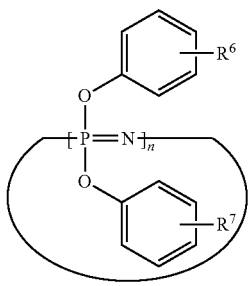

(3)

wherein, in the formula (3), n is an integer of 3 to 25, and $R^6$s and $R^7$s, which may be the same or different, are each hydrogen, or a hydroxyl, alkyl, alkoxy or glycidyl group.

The cyclic phosphazene oligomer represented by the formula (3) may be obtained as a commercially available product, examples of which include products (trade names: for example, FP-100, and FP-110) each manufactured by Fushimi Pharmaceutical Co., Ltd.

The content by percentage of the phosphazene compound is preferably from 10 to 30% by weight of the organic components contained in the epoxy resin composition, which comprise the epoxy resin (component A), the phenolic resin (component B), the elastomer (component D), the curing accelerator (component E) and the phosphazene compound (another component). In other words, if the content by percentage of the phosphazene compound is less than 10% by weight of the organic components, flame retardancy in the second thermosetting resin layer 2 declines. Additionally, the second thermosetting resin layer 2 tends to decline in performance of following unevenness of adherends, so that voids are generated therebetween. If the content by percentage is more than 30% by weight of the whole of the organic components, tackiness is easily generated in the front surface of the second thermosetting resin layer 2. As a result, especially when the second thermosetting resin layer 2 is in particular, in a sheet-like state, the second thermosetting resin layer 2 tends to decline in workability; thus, for example, the position adjustment of the second thermosetting resin layer with adherends becomes difficult.

When the metal hydroxide is used together with the phosphazene compound, the second thermosetting resin layer 2 can be obtained with excellent flame retardancy while the second thermosetting resin layer 2 certainly keeps flexibility necessary for sealing with the sheet. The use of the two together makes it possible to achieve a sufficient flame retardancy obtained when only the metal hydroxide is used, and a sufficient flexibility obtained when only the phosphazene compound is used.

When the metal hydroxide is used together with the phosphazene compound, the content by percentage of the total of the two is from 70 to 90% by weight, preferably from 75 to 85% by weight of the whole of the epoxy resin composition. If the content by percentage of the total is less than 70% by weight, the second thermosetting resin layer 2 tends not to gain a sufficient flame retardancy easily. If the content by percentage is more than 90% by weight, the second thermosetting resin layer 2 tends to decline in adhesiveness to adherends, so that voids are generated therebetween.

If necessary, a pigment such as carbon black may be incorporated into the epoxy resin composition, as may be other additives besides the above-mentioned individual components.

(Method for Forming the Second Thermosetting Resin Layer)

Hereinafter, in regards to a case where the second thermosetting resin layer is a sheet-like thermosetting resin layer, a procedure of a method for forming this layer will be described.

The above-described individual components are first mixed with each other to prepare an epoxy resin composition. The method for the mixing is not particularly limited as far as the method is a method capable of dispersing and mixing the individual components evenly. Thereafter, for example, the individual components are dissolved or dispersed into an organic solvent or some other to prepare a varnish. The thus-obtained varnish is coated into a sheet-like state. Alternatively, it is allowable to mix and knead the individual blend components directly by means of a kneader or some other to prepare a kneaded product, and extrude the thus obtained kneaded product into a sheet-like state.

In the formation procedure using the varnish, the components A to E and optional other additives are appropriately mixed with each other in a usual way, and dissolved or dispersed evenly in an organic solvent to prepare the varnish.

Next, the varnish is coated onto a support made of polyester or some other material, and then dried. In this way, the second thermosetting resin layer 2 can be yielded. If necessary, a peeling sheet, such as a polyester film, may be bonded onto the surface of the second thermosetting resin layer to protect the surface. The peeling sheet is peeled when the semiconductor chips are sealed.

The organic solvent is not particularly limited, and may be conventionally known organic solvents such as methyl ethyl ketone, acetone, cyclohexanone, dioxane, diethyl ketone, toluene, and ethyl acetate. These may be used alone or in combination of two or more thereof. It is usually preferred to use the organic solvent to adjust the solid concentration in the varnish into the range of 30 to 60% by weight.

After the removal of the organic solvent by the drying, the thickness of the sheet is not particularly limited. Usually, the thickness is set preferably into the range of 5 to 100 μm, more preferably in that of 20 to 70 μm from the viewpoint of the evenness of the thickness, and the remaining amount of the solvent.

In the meantime, in the process using the kneading, the components A to E and optional other additives are mixed with each other by a known means such as a mixer, and then the mixture is melted and kneaded to prepare a kneaded product. The manner for the melting and kneading is not particularly limited. An example thereof is a melting and kneading manner using a known kneader such as a mixing roll, a pressure kneader or an extruder. Conditions for the kneading are not particularly limited as far as the temperature therefor is equal to or higher than the respective softening points of the above-mentioned components. The temperature is, for example, from 30 to 150° C. Considering the thermosetting property of the epoxy resin, the temperature is preferably from 40 to 140° C., more preferably from 60 to 120° C., and the period is, for example, from 1 to 30 minutes and is preferably from 5 to 15 minutes. Through this process, the kneaded product can be prepared.

The resultant kneaded product is shaped by extrusion, whereby the second thermosetting resin layer 2 can be yielded. Specifically, after the melting and kneading, the kneaded product is extruded in the state of being kept at the high temperature state without being cooled, whereby the second thermosetting resin layer 2 can be formed. The method for the extrusion is not particularly limited, and examples thereof include T-die extrusion, roll rolling, roll kneading, co-extrusion, and calendar forming methods. The extruding temperature is not particularly limited as far as the temperature is equal to or higher than the respective softening points of the above-mentioned individual components. Considering the thermosetting property and the formability of the epoxy resin, the temperature is, for example, from 40 to 150° C., preferably from 50 to 140° C., even more preferably from 70 to 120° C. Through this process, the second thermosetting resin layer 2 can be formed.

The thus yielded second thermosetting resin layers may be laminated onto each other into a desired thickness if necessary. In other words, the sheet-like epoxy resin composition may be used in the form of a monolayered structure, and may also be used in the form of a laminate having a multilayered structure composed of two or more layers.

[Step of Exposing Electroconductive Member]

Figure 2C:
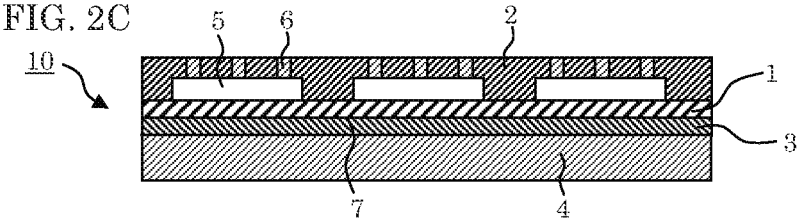

In the present embodiment, after the laminating of the second thermosetting resin layer 2 and before the peeling of the radiation curable pressure-sensitive adhesive layer 3, the electroconductive members 6 are exposed outward from the surface of the second thermosetting resin layer 2 (FIG. 2C).

The method for exposing the electroconductive members 6 is not particularly limited. An example thereof includes a method of applying, to the surface of the second thermosetting resin layer 2, polishing, laser radiation, cutting, dry etching or some other treatment. The method is preferably the polishing of the surface of the second thermosetting resin layer 2 because the surface flatness of the second thermosetting resin layer 2 is certainly maintained and the electroconductive members 6 can be made exposed in parallel. In this case, the surface of the second thermosetting resin layer 2 surface and the exposed region of the electroconductive members 6 are in substantially the same plane (that is, these two form a single plane).

[Radiation Curable Pressure-Sensitive Adhesive Layer Peeling Step]

Figure 2D:
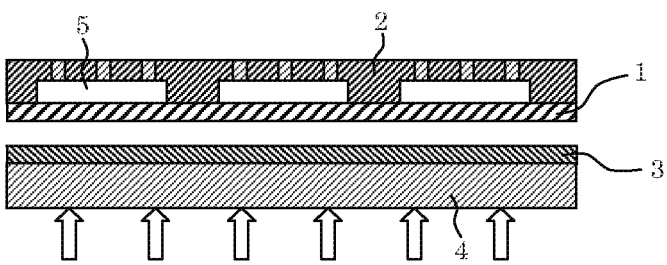
Figure 2E:
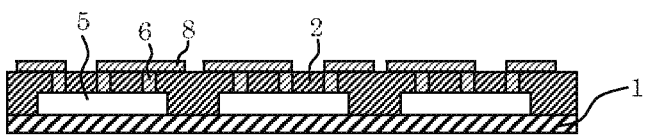

In a radiation curable pressure-sensitive adhesive layer peeling step, the radiation curable pressure-sensitive adhesive layer 3 is cured by irradiation from the support 4 side, thereby peeling the radiation curable pressure-sensitive adhesive layer 3 and the first thermosetting resin layer 1 from each other (see FIG. 2D). The radiation curable pressure-sensitive adhesive layer 3 is irradiated to increase the crosslinkage degree of the radiation curable pressure-sensitive adhesive layer 3 to decrease the adhesive strength thereof. This manner makes it possible to attain easily the peeling of the radiation curable pressure-sensitive adhesive layer 3 and the thermosetting resin layer 1 from each other at the interface 7 therebetween (see FIG. 2C).

Conditions for the irradiation are not particularly limited as far as the conditions permit the radiation curable pressure-sensitive adhesive layer 3 to be cured. In the case of radiating, for example, ultraviolet rays, the cumulative radiant exposure may be from about 10 to 1,000 mJ/cm$^2$.

When, after the peeling, the second thermosetting resin layer 2 and the first thermosetting resin layer 1 are not completely cured, the second thermosetting resin layer 2 and the first thermosetting resin layer 1 may be cured if necessary.

Of course, the production method of the present embodiment may further include, after the peeling of the radiation curable pressure-sensitive adhesive layer 3, exposing the electroconductive members 6 outward from the surface of the second thermosetting resin layer 2. In this way, the electroconductive members 6 are made exposed outward from the surface of the second thermosetting resin layer 2, to be subjected to a rewiring step. In order to expose the electroconductive members 6, the same methods as described above may be used.

In the present step, in the state that respective tips of the electroconductive members 6 are exposed to the surface of the second thermosetting resin layer 2, the respective surfaces of the electroconductive members 6 may be cleaned by plasma treatment or some other treatment before the rewiring step.

[Rewiring Step]

The present embodiment preferably includes the rewiring step. In this step, after the peeling of the radiation curable pressure-sensitive adhesive layer 3, rewires 8 to be connected to the exposed electroconductive members 6 are formed on the second thermosetting resin layer 2 (see FIG. 2E).

The method for forming the rewires may be, for example, a known method of using a known way to form a metal seed layer onto the exposed electroconductive members 6 and the second thermosetting resin layer 2, such as vacuum film deposition, and then performing a semi-additive method or some other known method to form the rewires 8.

Thereafter, an insulating layer made of polyimide, PBO or some other material may be formed on the rewires 8 and the second thermosetting resin layer 2.

[Bump Forming Step]

Figure 2F:
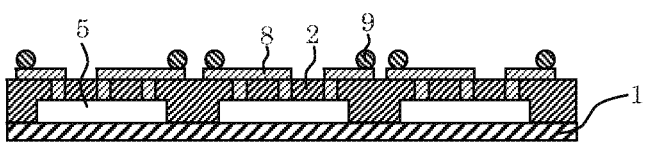

Next, bumping processing may be performed wherein bumps 9 are formed on the formed rewires 8 (see FIG. 2F). The bumping processing may be performed in a known manner, such as a manner using solder balls or solder plating. The material of the bumps is preferably the same material as used for the electroconductive members, which has been described in the semiconductor chip preparing step.

[Dicing Step]

Figure 2G:
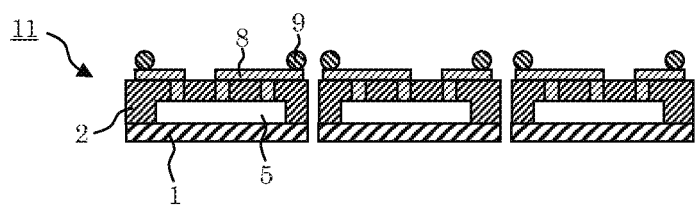

Finally, the laminate is diced which is composed of the first thermosetting resin layer 1, the semiconductor chips 5, the second thermosetting resin layer 2 and other optional elements such as the rewires 8 (see FIG. 2G). This step can form semiconductor devices 11 wherein the wires are drawn outward from its chip region. The dicing is performed usually in the state that the laminate is fixed onto a dicing sheet known in the prior art. The position adjustment of sites to be diced in the laminate may be attained by image recognition using infrared rays (IR).

In the present step, a cutting manner called full cut may be used when the dicing sheet is cut. A dicing device used in the present step is not particularly limited, and may be a device known in the prior art.

When the laminate is expanded after the dicing step, the expanding may be performed using an expanding device known in the prior art. The expanding device has a donut-form outer ring capable of pushing the laminated film downward through a ring for the dicing, and an inner ring that is smaller in diameter than the outer ring and supports the laminated film. This expanding step makes it possible to prevent any adjacent two of the semiconductor devices 11 from being damaged by contacting each other.

(Semiconductor Devices)

As has been illustrated in FIG. 2G, each of the semiconductor devices 11 has the semiconductor chip 5 buried in the second thermosetting resin layer 2, the first thermosetting resin layer 1 provided adjacently to the second thermosetting resin layer 2 to cover the second main surface 5b of the semiconductor chip 5, one or more of the rewires 8 that are formed on the second thermosetting resin layer 2 and connected to some of the electroconductive members 6, and solder bumps 9 located on I/O pads of the one or more rewires 8.

EXAMPLES

Hereinafter, preferred working examples of this invention will be demonstrated in detail. However, specific descriptions of materials, blend amounts and other factors in these examples do not limit the scope of the invention to these factors unless there is any limited description. The word "part(s)" denotes part(s) by weight.

(Formation of Radiation Curable Pressure-Sensitive Adhesive Layer)

Into a reactor equipped with a condenser tube, a nitrogen introducing tube, a thermostat, and a stirrer were put 86.4 parts of 2-ethylhexyl acrylate (hereinafter also referred to as "2EHA"), 13.6 parts of 2-hydroxyethyl acrylate (hereinafter also referred to as "HEA"), 0.2 part of benzoyl peroxide, and 65 parts of toluene. Under a nitrogen gas flow, these components were subjected to polymerization treatment at 61° C. for 6 hours to yield an acrylic polymer A.

To the acrylic polymer A were added 14.6 parts of 2-methacryloyloxyethyl isocyanate (hereinafter also referred to as "MOI"), and under an air gas flow, these components were subjected to addition reaction treatment at 50° C. for 48 hours to yield an acrylic polymer A'.

Next, to 100 parts of the acrylic polymer A' were added 8 parts of a polyisocyanate compound (trade name: "COLONATE L", manufactured by Nippon Polyurethane Industry Co., Ltd.), and 5 parts of a photopolymerization initiator (trade name: "IRGACURE 651", manufactured by Ciba Specialty Chemicals Ltd.) to yield a pressure-sensitive adhesive composition solution A.

In each of the working examples and the comparative examples, the resultant pressure-sensitive adhesive composition solution A was coated onto a polyethylene terephthalate film (PET film) subjected to release treatment and having a thickness of 50 μm, and then dried to form a radiation curable pressure-sensitive adhesive layer. The respective thicknesses of the produced radiation curable pressure-sensitive adhesive layers are shown in Table 1.

(Formation of First Thermosetting Resin Layer a)

The following were dissolved into methyl ethyl ketone: 5 parts of a bisphenol A type epoxy resin having an epoxy equivalent of 185 g/eq. (trade name: YL-980, manufactured by Yuka Shell Epoxy Co., Ltd.); 15 parts of a cresol novolak type epoxy resin having an epoxy equivalent of 198 g/eq. (trade name: KI-3000-4, manufactured by Tohto Kasei Co., Ltd.); 22.3 parts of an aralkyl type phenolic resin having a phenol equivalent of 175 g/eq. (trade name: MEHC-7851H, manufactured by Meiwa Plastic Industries, Ltd.); 227.5 parts of butyl acrylate/acrylonitrile/ethyl acrylate copolymer (trade name: SG-70L, manufactured by Nagase ChemteX Corp.); and 1 part of triphenylphosphine (manufactured by Shikoku Chemicals Corp.) as a curing catalyst. Thereto were added 83 parts of an inorganic filler (trade name: SE2050MC, manufactured by Admatechs Co., Ltd.; average particle diameter: 0.5 μm) to prepare an adhesive composition solution having a solid concentration of 32% by weight.

This adhesive composition solution was coated onto a release-treatment-subjected film as a peeling liner (separator). The film was a polyethylene terephthalate film having a thickness of 50 μm and subjected to silicone release treatment. The workpiece was then dried at 130° C. for 2 minutes to form a first thermosetting resin layer, having a thickness as shown in Table 1.

(Formation of First Thermosetting Resin Layer b)

The following were dissolved into methyl ethyl ketone: 15 parts of a bisphenol A type epoxy resin having an epoxy equivalent of 185 g/eq. (trade name: YL-980, manufactured by Yuka Shell Epoxy Co., Ltd.); 5 parts of a cresol novolak type epoxy resin having an epoxy equivalent of 198 g/eq. (trade name: KI-3000-4, manufactured by Tohto Kasei Co., Ltd.); 23.1 parts of an aralkyl type phenolic resin having a phenol equivalent of 175 g/eq. (trade name: MEHC-7851H, manufactured by Meiwa Plastic Industries, Ltd.); 7.65 parts of butyl acrylate/acrylonitrile/ethyl acrylate copolymer (trade name: SG-70L, manufactured by Nagase ChemteX Corp.); and 0.25 part of triphenylphosphine (manufactured by Shikoku Chemicals Corp.) as a curing catalyst. Thereto were added 34 parts of an inorganic filler (trade name: SE2050MC, manufactured by Admatechs Co., Ltd.; average particle diameter: 0.5 μm) to prepare an adhesive composition solution having a solid concentration of 32% by weight.

This adhesive composition solution was coated onto a release-treatment-subjected film as a peeling liner (separator). The film was a polyethylene terephthalate film having a thickness of 50 μm and subjected to silicone release treatment. The workpiece was then dried at 130° C. for 2 minutes to form a first thermosetting resin layer b having a thickness shown in Table 1.

(Formation of First Thermosetting Resin Layer c)

The following were dissolved into methyl ethyl ketone: 5 parts of a bisphenol A type epoxy resin having an epoxy equivalent of 185 g/eq. (trade name: YL-980, manufactured by Yuka Shell Epoxy Co., Ltd.); 15 parts of a cresol novolak type epoxy resin having an epoxy equivalent of 198 g/eq. (trade name: KI-3000-4, manufactured by Tohto Kasei Co., Ltd.); 22.3 parts of an aralkyl type phenolic resin having a phenol equivalent of 175 g/eq. (trade name: MEHC-7851H, manufactured by Meiwa Plastic Industries, Ltd.); 124.4 parts of butyl acrylate/acrylonitrile/ethyl acrylate copolymer (trade name: SG-70L, manufactured by Nagase ChemteX Corp.); and 1 part of triphenylphosphine (manufactured by Shikoku Chemicals Corp.) as a curing catalyst. Thereto were added 124.4 parts of an inorganic filler (trade name: SE2050MC, manufactured by Admatechs Co., Ltd.; average particle diameter: 0.5 μm) to prepare an adhesive composition solution having a solid concentration of 34% by weight.

This adhesive composition solution was coated onto a release-treatment-subjected film as a peeling liner (separator). The film was a polyethylene terephthalate film having a thickness of 50 μm and subjected to silicone release treatment. The workpiece was then dried at 130° C. for 2 minutes to form a first thermosetting resin layer c having a thickness as shown in Table 1.

(Formation of First Thermosetting Resin Layer d)

The following were dissolved into methyl ethyl ketone: 31.6 parts of a naphthalene type epoxy resin having an epoxy equivalent of 142 g/eq. (trade name: HP4032D, manufactured by DIC Corp.); 7.9 parts of a trishydroxyphenylmethane type epoxy resin having an epoxy equivalent of 169 g/eq. (trade name: EPPN501HY, manufactured by Dainippon Ink & Chemicals. Inc.); 11.8 parts of an aralkyl type phenolic resin having a phenol equivalent of 175 g/eq. (trade name: MEHC-7851S, manufactured by Meiwa Plastic Industries, Ltd.); 35.5 parts of an aralkyl type phenolic resin having a phenol equivalent of 175 g/eq. (trade name: MEHC-7851H, manufactured by Meiwa Plastic Industries, Ltd.); 12 parts of butyl acrylate/acrylonitrile/glycidyl methacrylate copolymer (trade name: SG-28GM, manufactured by Nagase ChemteX Corp.); and 1 part of triphenylphosphine (manufactured by Shikoku Chemicals Corp.) as a curing catalyst. Thereto were added 100 parts of an inorganic filler (trade name: SE2050MC, manufactured by Admatechs Co., Ltd.; average particle diameter: 0.5 μm) to prepare an adhesive composition solution having a solid concentration of 35% by weight.

This adhesive composition solution was coated onto a release-treatment-subjected film as a peeling liner (separator). The film was a polyethylene terephthalate film having a thickness of 50 μm and subjected to silicone release treatment. The workpiece was then dried at 130° C. for 2 minutes to form a first thermosetting resin layer d having a thickness shown in Table 1.

(Formation of First Thermosetting Resin Layer e)

The following were dissolved into methyl ethyl ketone: 5 parts of a bisphenol A type epoxy resin having an epoxy equivalent of 185 g/eq. (trade name: YL-980, manufactured by Yuka Shell Epoxy Co., Ltd.); 15 parts of a cresol novolak type epoxy resin having an epoxy equivalent of 198 g/eq. (trade name: KI-3000-4, manufactured by Tohto Kasei Co., Ltd.); 22.3 parts of an aralkyl type phenolic resin having a phenol equivalent of 175 g/eq. (trade name: MEHC-7851H, manufactured by Meiwa Plastic Industries, Ltd.); 342 parts of butyl acrylate/acrylonitrile/ethyl acrylate copolymer (trade name: SG-70L, manufactured by Nagase ChemteX Corp.); and 1 part of triphenylphosphine (manufactured by Shikoku Chemicals Corp.) as a curing catalyst. Thereto were added 149.5 parts of an inorganic filler (trade name: SE2050MC, manufactured by Admatechs Co., Ltd.; average particle diameter: 0.5 μm) to prepare an adhesive composition solution having a solid concentration of 32% by weight.

This adhesive composition solution was coated onto a release-treatment-subjected film as a peeling liner (separator). The film was a polyethylene terephthalate film having a thickness of 50 μm and subjected to silicone release treatment. The workpiece was then dried at 130° C. for 2 minutes to form a first thermosetting resin layer e having a thickness shown in Table 1.

(Formation of Supporting Structure)

A glass plate of 725 μm thickness was prepared as a support, and then the radiation curable pressure-sensitive adhesive layer formed as described above was transferred onto the support by a laminator. Conditions for the laminating were as follows:

<Laminating Conditions>

Laminator: roll laminator
Laminating speed: 1 m/min
Laminating temperature: 45° C.

Next, the radiation curable pressure-sensitive adhesive layer and each of the first thermosetting resin layers were bonded to each other by a laminator to yield a supporting structure. Conditions for the laminating were as follows:

<Laminating Conditions>

Laminator: roll laminator
Laminating speed: 3 m/min
Laminating temperature: 75° C.

(Arrangement of Semiconductor Chips)

The separator was peeled off from the first thermosetting resin layer of the supporting structure, and then a flip chip bonder was used to arrange semiconductor chips onto the first thermosetting resin layer under conditions described below. At this time, the semiconductor chips were arranged so that the respective back surfaces of the chips (the surface opposite to the bump-formed surface) and the first thermosetting resin layer face to each other.

<Semiconductor Chips>

Semiconductor chip size: 7.3 mm square
Bump material: Cu (thickness: 30 μm), and Sn—Ag (thickness: 15 μm)
The number of the bumps: 544
Bump pitch: 50 μm
The number of the chips: 16 (4×4)

<Bonding Conditions>

Device: bonder manufactured by Panasonic Corp.
Bonding conditions: 150° C., 49 N, 10 sec.

(Formation of Kneaded Product of Second Thermosetting Resin Layer)

The following components A to E were melted and kneaded by a roll kneader at 80° C. for 10 minutes to yield a kneaded product:

Component A (epoxy resin): bisphenol F type epoxy resin (trade name: YSLV-80XY, manufactured by Tohto Kasei Co., Ltd.; epoxy equivalent: 200 g/eq.; softening point: 80° C.) 5.7 parts Component B (phenolic resin): phenolic resin having a biphenylaralkyl skeleton (trade name: MEH7851SS, manufactured by Meiwa Plastic Industries, Ltd.; hydroxyl equivalent: 203 g/eq.; softening point: 67° C.) 6.0 parts Component C (elastomer): acrylic thermoplastic resin (trade name: LA-2140, manufactured by Kuraray Co., Ltd.) 3.6 parts Component D (inorganic filler): spherical fused silica powder (trade name: FB-9454, manufactured by Denki Kagaku Kogyo K.K.; average particle diameter: 20 μm) 88 parts Component E (curing accelerator): imidazole catalyst as a curing catalyst (trade name: 2PHZ-PW, manufactured by Shikoku Chemicals Corp.) 0.14 part Examples 1 to 3 and Comparative Examples 1 and 2

In each of Examples 1 to 3 and Comparative Examples 1 and 2, the above-mentioned kneaded product was extruded. The extruded product was laminated onto one of the above-mentioned first thermosetting resin layers by a reduced-pressure pressing so as to cover the semiconductor chips according to combinations of elements shown in Table 1. In this way, a second thermosetting resin layer of 1 mm thickness was formed. Through the above-mentioned steps, a laminate according to each of Examples 1 to 3 and Comparative Examples 1 and 2 was produced, which had the radiation curable pressure-sensitive adhesive layer, the first thermosetting resin layer, the semiconductor chips and the second thermosetting resin layer.

<Reduced-Pressure Pressing Conditions>

Device: press manufactured by Mikado Technos Co., Ltd.
Pressing conditions: pressing at 1.7 kN and 80° C. under a reduced pressure of 99.3 Pa for 1 minute, and then pressing at 8.5 kN and 80° C. under the same pressure for 2 minutes.

(Measurement of Respective Lowest Melt Viscosities of First Thermosetting Resin Layers)

Before each of the first thermosetting resin layers was bonded to the radiation curable pressure-sensitive adhesive layer, the lowest melt viscosity of the first thermosetting resin layer was measured (before thermally cured). The lowest melt viscosity was a value obtained by measuring the first thermosetting resin layer by a parallel plate method using a rheometer (trade name: RS-1, manufactured by HAAKE GmbH). More specifically, the melt viscosity was measured in the range of temperatures of 50 to 200° C. under the following conditions: a gap of 100 μm, a rotary cone diameter of 20 mm, and a rotating speed of $10\ s^{-1}$; and the lowest value out of the melt viscosities obtained at this time was defined as the lowest melt viscosity. The results are shown in Table 1.

(Check as to Whether or not Semiconductor Chips were Shifted Out of Position at the Time of Laminating of Second Thermosetting Resin Layer)

When the second thermosetting resin layer was laminated onto the first thermosetting resin layer in each of Examples 1 to 3 and Comparative Examples 1 and 2, a length-measuring microscope (manufactured by Keyence Corp.; magnification:×500) was used to check whether or not the respective positions of the semiconductor chips on the first thermosetting resin layer were changed. When the maximum value out of the respective position-change-quantities of the semiconductor chips was 50 μm or less, the present sample was judged to be good. When the maximum value was more than 50 μm, the sample was judged to be bad. As the position-change-quantity of each of the semiconductor chips, the following was used: the quantity of a change in the position of the apex of the semiconductor chip when viewed in plan before and after observation. The results are shown in Table 1.

(Measurement of Peeling Force between Radiation Curable Pressure-Sensitive Adhesive Layer and First Thermosetting Resin Layers)

In regards to the laminate according to each of Examples 1 to 3 and Comparative Examples 1 and 2, a measurement was made regarding the peeling force between the radiation curable pressure-sensitive adhesive layer and the first thermosetting resin layer. Specifically, ultraviolet rays were first radiated to the laminate from the support side thereof to cure the radiation curable pressure-sensitive adhesive layer. For the ultraviolet ray radiation, an ultraviolet radiating device (trade name: MM810, manufactured by Nitto Seiki Co., Ltd.) was used. The ultraviolet radiant exposure was set to 400 mJ/cm². Thereafter, between the radiation curable pressure-sensitive adhesive layer and the first thermosetting resin layer, the peeling force (N/20 mm) was measured. More specifically, a device (trade name: "AUTOGRAPH AGS-H") manufactured by Shimadzu Corp. was used as a tensile tester to make a T-shape peeling test (according to JIS K 6854-3) under the following conditions: a temperature of 23±2° C., a peeling angle of 180°, a peeling rate of 300 mm/min, and a distance of 100 mm between its chucks. When the laminate gave a peeling force of 20 N/20 mm or less, the laminate was judged to be good. When the laminate gave a peeling force more than 20 N/20 mm, the laminate was judged to be bad. The results are shown in Table 1.

TABLE 1

|  |  | Example 1 | Example 2 | Example 3 | Comparative Example 1 | Comparative Example 2 |
|---|---|---|---|---|---|---|
| Support | Material | PET | PET | PET | PET | PET |
|  | Thickness (μm) | 50 | 50 | 50 | 50 | 50 |
| Radiation curable pressure-sensitive adhesive layer | Pressure-sensitive adhesive composition solution species | A | A | A | A | A |
|  | Thickness (μm) | 30 | 30 | 30 | 30 | 30 |
| First thermosetting resin layer | First thermosetting resin layer species | a | b | c | d | e |
|  | Thickness (μm) | 70 | 70 | 70 | 70 | 70 |
|  | Lowest melt viscosity (Pa·s) | $4.2 \times 10^2$ | $5.6 \times 10^3$ | $7.0 \times 10^3$ | $1.0 \times 10^2$ | $5.1 \times 10^4$ |
| Evaluation as to whether or not semiconductor chips were shifted out of position |  | Good | Good | Good | Bad | Bad |
| Peeling force between radiation curable pressure-sensitive adhesive layer and first thermosetting resin layer after radiation of ultraviolet rays |  | Good | Good | Good | Bad | Good |

As is evident from Table 1, in each of the laminates according to Examples 1 to 3, the lowest melt viscosity of the first thermosetting resin layer was in the range of $5 \times 10^2$ Pa·s or more and $1 \times 10^4$ Pa·s or less; thus, when the second thermosetting resin layer was laminated, the semiconductor chips were not shifted out of position. Moreover, the radiation curable pressure-sensitive adhesive layer and the first thermosetting resin layer were able to be satisfactorily peeled from each other. On the other hand, in the laminate of Comparative Example 1, the semiconductor chips were shifted out of position, and further the radiation curable pressure-sensitive adhesive layer and the first thermosetting resin layer were unable to be satisfactorily peeled from each other. It can be considered that this is because the first thermosetting resin layer was increased in fluidity since the lowest melt viscosity of the first thermosetting resin layer was less than $5 \times 10^2$ Pa·s. In the laminate of Comparative Example 2, between the radiation curable pressure-sensitive adhesive layer and the first thermosetting resin layer, the peeling force was good. However, the semiconductor chips were shifted out of positions. It can be considered that this is because the lowest melt viscosity of the first thermosetting resin layer was more than $1 \times 10^4$ Pa·s, whereby the first thermosetting resin layer was largely lowered in fluidity, so that the adhesive power to the chips was also declined.

What is claimed is:

1. A method for producing a semiconductor device including a semiconductor chip, comprising:

preparing semiconductor chips, each having a first main surface on which an electroconductive member is formed;

preparing a supporting structure in which over a support configured to transmit radiation, a radiation curable pressure-sensitive adhesive layer and a first thermosetting resin layer are laminated in this order;

arranging the semiconductor chips on the first thermosetting resin layer to face the first thermosetting resin layer to a second main surface of each of the semiconductor chips that is opposite to the first main surface thereof;

laminating a second thermosetting resin layer over the first thermosetting resin layer to cover the semiconductor chips, wherein the second thermosetting resin layer is a sheet-like thermosetting resin layer; and curing the radiation curable pressure-sensitive adhesive layer by irradiating from a support side to peel the radiation curable pressure-sensitive adhesive layer and the first thermosetting resin layer from each other.

2. The method for producing a semiconductor device according to claim 1, wherein the first thermosetting resin layer has a lowest melt viscosity of $5 \times 10^2$ Pa·s or more and $1 \times 10^4$ Pa·s or less at a temperature of 50 to 200° C.

3. The method for producing a semiconductor device according to claim 1, wherein the second thermosetting resin layer comprises an epoxy resin, a phenolic resin, a filler, and an elastomer.

4. The method for producing a semiconductor device according to claim 1, further comprising exposing the electroconductive member outward from a surface of the second thermosetting resin layer after the laminating of the second thermosetting resin layer and before the peeling of the radiation curable pressure-sensitive adhesive layer.

5. The method for producing a semiconductor device according to claim 4, further comprising forming a rewire connected to the exposed electroconductive member on the second thermosetting resin layer.

6. The method for producing a semiconductor device according to claim 1, further comprising forming a rewire connected to the exposed electroconductive member on the second thermosetting resin layer.

* * * * *